(12) United States Patent
Onuki et al.

(10) Patent No.: US 12,015,012 B2
(45) Date of Patent: Jun. 18, 2024

(54) SEMICONDUCTOR DEVICE

(71) Applicant: Semiconductor Energy Laboratory Co., Ltd., Atsugi (JP)

(72) Inventors: Tatsuya Onuki, Atsugi (JP); Takanori Matsuzaki, Atsugi (JP); Yuki Okamoto, Isehara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 163 days.

(21) Appl. No.: 17/613,605

(22) PCT Filed: May 25, 2020

(86) PCT No.: PCT/IB2020/054928
§ 371 (c)(1),
(2) Date: Nov. 23, 2021

(87) PCT Pub. No.: WO2020/245697
PCT Pub. Date: Dec. 10, 2020

(65) Prior Publication Data
US 2022/0238491 A1    Jul. 28, 2022

(30) Foreign Application Priority Data

Jun. 7, 2019   (JP) ................................ 2019-107512
Jul. 4, 2019   (JP) ................................ 2019-124885

(51) Int. Cl.
*H01L 27/108*   (2006.01)
*G11C 5/06*   (2006.01)
(Continued)

(52) U.S. Cl.
CPC .......... *H01L 25/0657* (2013.01); *G11C 5/063* (2013.01); *H01L 29/78693* (2013.01);
(Continued)

(58) Field of Classification Search
CPC .... H10B 12/50; G11C 5/063; H01L 29/78693
See application file for complete search history.

(56) References Cited

U.S. PATENT DOCUMENTS 8,378,403 B2   2/2013   Kato
8,637,865 B2   1/2014   Kato
(Continued)

FOREIGN PATENT DOCUMENTS

JP   2015-039006 A   2/2015
JP   2018-201003 A   12/2018
(Continued)

OTHER PUBLICATIONS

International Search Report (Application No. PCT/IB2020/054928) dated Aug. 18, 2020.
(Continued)

*Primary Examiner* — Walter H Swanson
(74) *Attorney, Agent, or Firm* — Eric J. Robinson; Robinson Intellectual Property Law Office, P.C.

(57) ABSTRACT

A semiconductor device with a novel structure is provided. The semiconductor device includes a silicon substrate including a first circuit, a first element layer including a second circuit, and a second element layer including a third circuit. The first circuit includes a first transistor. The second circuit includes a second transistor. The third circuit includes a memory cell. The memory cell includes a third transistor and a capacitor. The first element layer and the second element layer constitute a stacked block stacked and provided in a direction perpendicular or substantially perpendicular to a surface of the silicon substrate. A plurality of stacked blocks are stacked and provided in the direction perpendicular or substantially perpendicular to the surface of the silicon substrate. Each of the plurality of stacked blocks includes a first wiring provided in the direction perpendicular or substantially perpendicular to the surface of the silicon (Continued)

substrate. The plurality of stacked blocks are electrically connected to each other through the wiring.

7 Claims, 19 Drawing Sheets

(51) Int. Cl.
  *H01L 25/065* (2023.01)
  *H01L 29/786* (2006.01)
  *H10B 12/00* (2023.01)
  *H01L 23/00* (2006.01)

(52) U.S. Cl.
  CPC ........... *H10B 12/315* (2023.02); *H10B 12/50* (2023.02); *H01L 24/16* (2013.01); *H01L 25/0655* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2924/1431* (2013.01); *H01L 2924/1436* (2013.01)

(56) References Cited

U.S. PATENT DOCUMENTS

| | | | |
|---|---|---|---|
| 9,542,977 | B2 | 1/2017 | Onuki et al. |
| 9,728,243 | B2 | 8/2017 | Kato |
| 9,780,093 | B2 | 10/2017 | Kato |
| 10,319,723 | B2 | 6/2019 | Kato |
| 10,622,059 | B2 | 4/2020 | Onuki |
| 11,094,373 | B2 | 8/2021 | Onuki |
| 11,751,409 | B2 * | 9/2023 | Atsumi ............... H10B 41/70 257/43 |
| 2012/0001243 | A1 | 1/2012 | Kato |
| 2012/0063208 | A1 | 3/2012 | Koyama et al. |
| 2019/0057734 | A1 | 2/2019 | Onuki |
| 2019/0287974 | A1 | 9/2019 | Kato |
| 2020/0043530 | A1 * | 2/2020 | Shibata ............... H01L 27/0688 |

FOREIGN PATENT DOCUMENTS

| | | |
|---|---|---|
| TW | 201216454 | 4/2012 |
| WO | WO-2012/002186 | 1/2012 |
| WO | WO-2017/158465 | 9/2017 |

OTHER PUBLICATIONS

Written Opinion (Application No. PCT/IB2020/054928) dated Aug. 18, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

* cited by examiner

FIG. 15A
| Amorphous | Intermediate state New boundary region | Crystal |
|---|---|---|
| • completely amorphous | Crystalline<br>• CAAC<br>• nc<br>• CAC<br>excluding single crystal and poly crystal | • single crystal<br>• poly crystal |
FIG. 15B
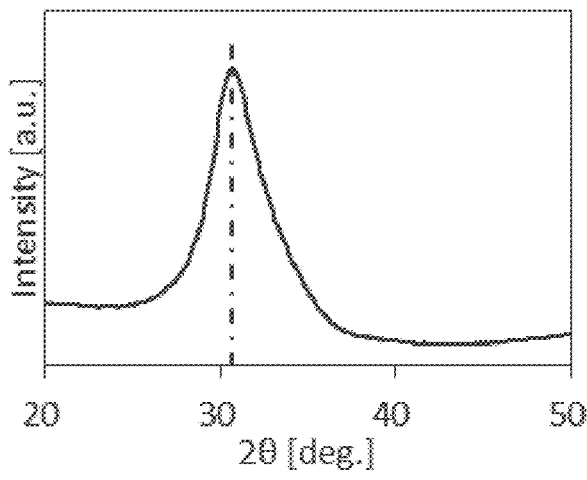
FIG. 15C
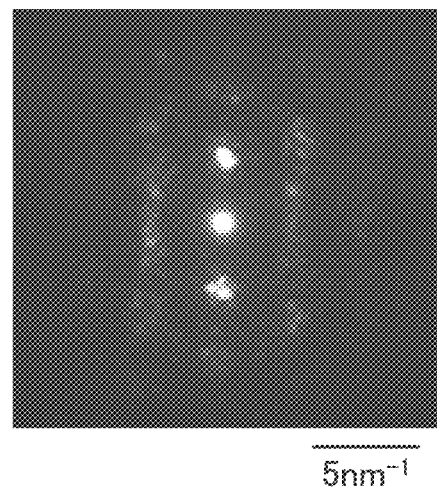

SEMICONDUCTOR DEVICE

TECHNICAL FIELD

In this specification, a semiconductor device and the like are described.

In this specification, a semiconductor device refers to a device that utilizes semiconductor characteristics, and means a circuit including a semiconductor element (a transistor, a diode, a photodiode, or the like), a device including the circuit, and the like. In addition, the semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor applicable to a transistor, a metal oxide has been attracting attention. An In—Ga—Zn oxide called "IGZO" and the like is a typical multi-component metal oxide. From researches on IGZO, a CAAC (c-axis aligned crystalline) structure and an nc (nanocrystalline) structure, which are neither single crystal nor amorphous, have been found (e.g., Non-Patent Document 1).

It has been reported that a transistor including a metal oxide semiconductor in a channel formation region (hereinafter referred to as an "oxide semiconductor transistor" or an "OS transistor" in some cases) has extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate provided with a Si transistor.

REFERENCES

Patent Documents

[Patent Document 1] United States Patent Application Publication No. 2012/0063208

Non-Patent Documents

[Non-Patent Document 1] S. Yamazaki et al., "Properties of crystalline In—Ga—Zn-oxide semiconductor and its transistor characteristics," Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide," Jpn. J. Appl. Phys., vol. 51, 021201 (2012).
[Non-Patent Document 3] S. Amano et al., "Low Power LC Display Using In—Ga—Zn-Oxide TFTs Based on Variable Frame Frequency," SID Symp. Dig. Papers, vol. 41, pp. 626-629 (2010).
[Non-Patent Document 4] T. Ishizu et al., "Embedded Oxide Semiconductor Memories: A Key Enabler for Low-Power ULSI," ECS Tran., vol. 79, pp. 149-156 (2017).

SUMMARY OF THE INVENTION

Problems to be Solved by the Invention

An object of one embodiment of the present invention is to provide a semiconductor device or the like having a novel structure. Another object of one embodiment of the present invention is to provide a semiconductor device or the like functioning as a memory device that utilizes extremely low off-state current and having a novel structure that allows a reduction of manufacturing cost. Another object of one embodiment of the present invention is to provide a semiconductor device or the like functioning as a memory device that utilizes extremely low off-state current and having a novel structure that excels in low power consumption. Another object of one embodiment of the present invention is to provide a semiconductor device or the like functioning as a memory device that utilizes extremely low off-state current and having a novel structure that allows a reduction in the size of the device. Another object of one embodiment of the present invention is to provide a semiconductor device or the like functioning as a memory device that utilizes extremely low off-state current and having a novel structure that allows high reliability with a small variation in electrical characteristics of transistors.

The description of a plurality of objects does not disturb the existence of each object. One embodiment of the present invention does not necessarily achieve all the objects described as examples. Furthermore, objects other than those listed are apparent from the description of this specification, and such objects can be objects of one embodiment of the present invention.

Means for Solving the Problems

One embodiment of the present invention is a semiconductor device that includes a silicon substrate including a first circuit, a first element layer including a second circuit, and a second element layer including a third circuit. The first circuit includes a first transistor. The second circuit includes a second transistor. The third circuit includes a memory cell. The memory cell includes a third transistor and a capacitor. The first element layer and the second element layer constitute a stacked block stacked and provided in a direction perpendicular or substantially perpendicular to a surface of the silicon substrate. A plurality of stacked blocks are stacked and provided in the direction perpendicular or substantially perpendicular to the surface of the silicon substrate. Each of the plurality of stacked blocks includes a first wiring provided in the direction perpendicular or substantially perpendicular to the surface of the silicon substrate. The first wirings of the plurality of stacked blocks are electrically connected to each other.

In one embodiment of the present invention, the first circuit in the semiconductor device preferably has a function of outputting a signal for driving the memory cell and data to be written to the memory cell to the first wiring and a function of amplifying data read from the memory cell into the first wiring.

In one embodiment of the present invention, the second circuit in the semiconductor device preferably has a function of amplifying a potential of a second wiring electrically connected to the memory cell and transmitting the amplified potential to the first wiring and a function of transmitting a potential of the first wiring to the second wiring.

In one embodiment of the present invention, the second transistor and the third transistor in the semiconductor device each include a semiconductor layer including a metal oxide in a channel formation region.

In one embodiment of the present invention, the metal oxide in the semiconductor device preferably contains In, Ga, and Zn.

In one embodiment of the present invention, a layer including the capacitor in the semiconductor device is preferably provided above a layer including the third transistor.

In one embodiment of the present invention, the layer including the capacitor in the semiconductor device is preferably stacked and provided.

Note that other embodiments of the present invention will be shown in the description of the following embodiments and the drawings.

Effect of the Invention

With one embodiment of the present invention, a semiconductor device or the like having a novel structure can be provided. With another embodiment of the present invention, a semiconductor device or the like functioning as a memory device that utilizes extremely low off-state current and having a novel structure that allows a reduction of manufacturing cost can be provided. With another embodiment of the present invention, a semiconductor device or the like functioning as a memory device that utilizes extremely low off-state current and having a novel structure that excels in low power consumption can be provided. With another embodiment of the present invention, a semiconductor device or the like functioning as a memory device that utilizes extremely low off-state current and having a novel structure that allows a reduction in the size of the device can be provided. With another embodiment of the present invention, a semiconductor device or the like functioning as a memory device that utilizes extremely low off-state current and having a novel structure that allows high reliability with a small variation in electrical characteristics of transistors can be provided.

The description of a plurality of effects does not disturb the existence of other effects. In addition, one embodiment of the present invention does not necessarily achieve all the effects described as examples. Furthermore, in one embodiment of the present invention, other objects, effects, and novel features will be apparent from the description of this specification and the drawings.

BRIEF DESCRIPTION OF THE DRAWINGS

FIG. 15A is a diagram showing classifications of crystal structures of IGZO. FIG. 15B is a diagram showing an XRD spectrum of a CAAC-IGZO film. FIG. 15C is a diagram showing nanobeam electron diffraction patterns of a CAAC-IGZO film.

MODE FOR CARRYING OUT THE INVENTION

Figure 1:
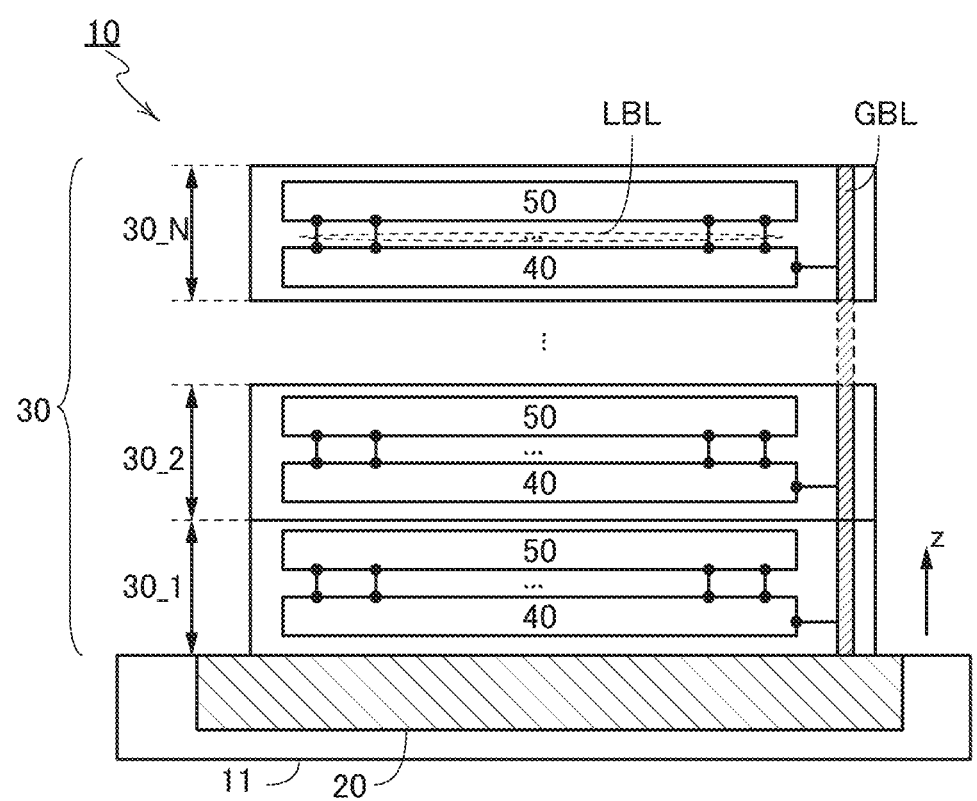
FIG. 1 is a diagram illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

In the drawings, the same elements, elements having similar functions, elements formed of the same material, elements formed at the same time, or the like are sometimes denoted by the same reference numerals, and repeated description thereof is omitted in some cases.

In this specification, a power supply potential VDD is sometimes abbreviated to a potential VDD, VDD, or the like, for example. The same applies to other components (e.g., a signal, voltage, a circuit, an element, an electrode, a wiring, and the like).

Moreover, when a plurality of components are denoted by the same reference numerals, and, in particular, need to be distinguished from each other, an identification sign such as "_1," "_2," "[n]," or "[m,n]" is sometimes added to the reference numerals. For example, a second wiring GL is referred to as a wiring GL[2].

Embodiment 1

Structure examples of a semiconductor device according to one embodiment of the present invention are described with reference to FIG. 1 to FIG. 11.

Note that a semiconductor device refers to a device that utilizes semiconductor characteristics, and means a circuit including a semiconductor element (a transistor, a diode, a photodiode, or the like) and a device including the circuit. The semiconductor device described in this embodiment can function as a memory device that utilizes a transistor with extremely low off-state current.

FIG. 1 is a diagram showing a block diagram of a semiconductor device described in this embodiment. A semiconductor device 10 illustrated in FIG. 1 includes a peripheral circuit 20 provided on a silicon substrate and stacked blocks 30_1 to 30_N (N is a natural number) provided with a plurality of memory cells that constitute a memory cell array. The stacked blocks 30_1 to 30_N are sometimes collectively referred to as a stacked block 30. Alternatively, a structure applicable to the stacked blocks 30_1 to 30_N is sometimes referred to as the stacked block 30.

Note that although the description is made assuming that the peripheral circuit 20 is provided on the silicon substrate, this embodiment is not limited thereto. Note that the silicon substrate refers to a substrate including silicon as a semiconductor material, for example, a single crystal silicon substrate. Note that, without being limited to silicon, a material containing Ge (germanium), SiGe (silicon germanium), GaAs (gallium arsenide), GaAlAs (gallium aluminum arsenide), or the like may be used for the substrate.

The peripheral circuit 20 includes circuits for outputting signals for driving memory cells, such as a row driver and a column driver. A row driver and a column driver are simply referred to as driver circuits or drivers in some cases.

The row driver and the column driver preferably drive the memory cells at high speed. Thus, the row driver and the column driver each preferably include a transistor that operates at high speed. Each transistor included in the row driver and the column driver is preferably a transistor that has high field-effect mobility and includes silicon in a channel formation region (a Si transistor).

The row driver is a circuit having a function of outputting signals for driving the memory cells to word lines. The word line has a function of transmitting word signals to the memory cells. The row driver is sometimes referred to as a word line driver circuit. Note that the row driver includes a decoder circuit for selecting a word line in accordance with a designated address, a buffer circuit, and the like. The column driver is a circuit having a function of outputting signals for driving the memory cells to bit lines, a function of outputting data to be written to the memory cells, and a function of amplifying data read from the memory cells into the bit lines. A bit line BL has a function of transmitting data to the memory cells. The column driver is sometimes referred to as a bit line driver circuit. Note that the column driver includes a sense amplifier, a precharge circuit, a decoder circuit for selecting a bit line in accordance with a designated address, and the like.

A data signal supplied to the bit line corresponds to a signal written to a memory cell or a signal read from the memory cell. The data signal is described as a binary signal having a high-level or low-level potential corresponding to data 1 or data 0. Note that the data signal may be a multilevel signal higher than or equal to a ternary signal. The high-level potential is VDD, and the low-level potential is VSS or a ground potential (GND). A signal supplied to the bit line BL can be, other than the data signal, a precharge potential for reading data, for example. The precharge potential can be VDD/2.

The stacked blocks 30_1 to 30_N each include an element layer 40 and an element layer 50.

The element layer 50 includes a plurality of memory cells each including a transistor and a capacitor.

The memory cells included in the element layer 50 can each be referred to as a DOSRAM (Dynamic Oxide Semiconductor Random Access Memory) using a transistor including an oxide semiconductor in a channel formation region (hereinafter referred to as an OS transistor) for a memory. The memory cell can be formed using one transistor and one capacitor, so that a high-density memory can be achieved. In addition, with the use of an OS transistor, a data retention period can be extended.

In the structure of one embodiment of the present invention, the use of a memory cell including an OS transistor enables electric charge corresponding to desired voltage to be retained in the capacitor located at the other of a source and a drain by utilizing extremely low leakage current flowing between the source and the drain in an off state (hereinafter off-state current). In other words, data written once can be retained for a long time in the memory cell. Therefore, the frequency of data refresh can be reduced and low power consumption can be achieved.

In addition, the memory cell using an OS transistor can rewrite and read data by charging or discharging of electric charge; thus, a substantially unlimited number of times of data writing and data reading is possible. Unlike a magnetic memory, a resistive random access memory, or the like, the memory cell using an OS transistor has no change in the structure at the atomic level and thus exhibits high rewrite endurance. Furthermore, unlike a flash memory, the memory cell using an OS transistor does not show instability due to an increase of electron trap centers even when rewriting operation is repeated.

In addition, the memory cell using an OS transistor can be freely provided, for example, over a silicon substrate including a transistor including silicon in a channel formation region (hereinafter a Si transistor) or an element layer including an OS transistor, so that integration can be easily performed. Furthermore, an OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. An electric network where input and output of signals flowing between a source and a drain can be independently controlled in accordance with voltage applied to a gate electrode or a back gate electrode can be constituted. Therefore, it is possible to design circuits under the same thought as LSI. Furthermore, electrical characteristics of the OS transistor are better than those of a Si transistor in a high-temperature environment. Specifically, the ratio between on-state current and off-state current is large even at a high temperature higher than or equal to 125° C. and lower than or equal to 150° C.; thus, favorable switching operation can be performed. Moreover, the OS transistor favorably operates in the range of higher than or equal to −40° C. and lower than or equal to 190° C. In other words, the OS transistor has extremely high heat resistance.

This heat resistance is higher than the heat resistance of a phase change memory (PCM) (at higher than or equal to −40° C. and lower than or equal to 150° C.), the heat resistance of a resistance random access memory (ReRAM) (higher than or equal to −40° C. and lower than or equal to 125° C.), the heat resistance of a magnetoresistive random access memory (MRAM) (higher than or equal to −40° C. and lower than or equal to 105° C.), or the like.

The element layer 40 includes a circuit that has a function of amplifying a potential of a bit line connected to the memory cell and transmitting the amplified potential to a bit line connected to the peripheral circuit 20 and a function of transmitting a potential of the peripheral circuit 20 to the bit line connected to the memory cell. The bit line connected to the peripheral circuit 20 is illustrated as a wiring GBL. In addition, a bit line connected to the element layer 50 including the memory cell is illustrated as a wiring LBL. The wiring GBL is referred to as a global bit line in some cases. The wiring LBL is referred to as a local bit line in some cases. The wiring LBL and the wiring GBL have functions of bit lines for data writing to or data reading from the memory cells. Note that in some drawings, the wiring LBL and the wiring GBL are denoted by thick lines, thick dotted lines, or the like to increase visibility.

To describe the arrangement of each component, a z-axis direction is defined in a schematic diagram illustrated in FIG. 1. Note that for easy understanding, the z-axis direction is sometimes referred to as a direction perpendicular to a surface of a silicon substrate 11 in this specification.

As illustrated in FIG. 1, the stacked block 30 or the element layer 40 and the element layer 50 that constitute the stacked block 30 are stacked and provided in a direction perpendicular or substantially perpendicular to the surface of the silicon substrate 11. Note that "substantially perpendicular" refers to a state where an arrangement angle is greater than or equal to 850 and less than or equal to 95°. In addition, the wiring LBL and the wiring GBL provided in the stacked block 30 are provided in the direction perpendicular or substantially perpendicular to the surface of the silicon substrate 11. The structure can increase the number of memory cells arranged per unit area and thus can increase memory density.

Figure 2:
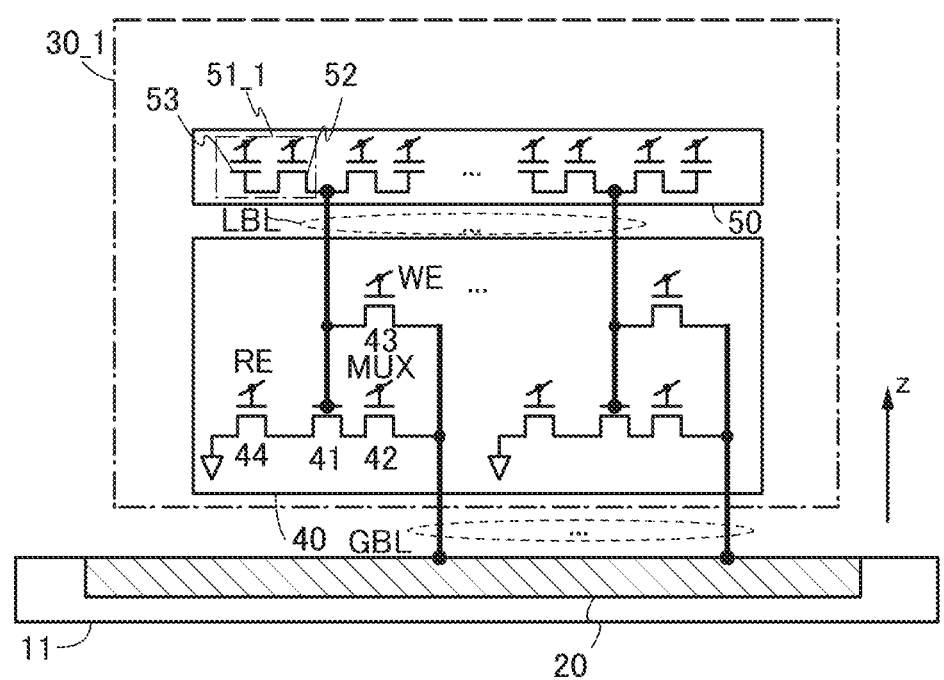
FIG. 2 is a diagram illustrating a structure example of a semiconductor device.

FIG. 2 is a circuit diagram of the stacked block 30_1 illustrating a structure example of a circuit included in the element layer 40 and a structure example of a memory cell included in the element layer 50. A memory cell 51_1 includes a transistor 52 and a capacitor 53.

One of a source and a drain of the transistor 52 is connected to the wiring LBL. A gate of the transistor 52 is connected to a wiring for supplying a word signal (also referred to as a word line WL). The transistor 52 is connected to the capacitor 53.

The transistor 52 is preferably an OS transistor. As described above, an OS transistor has extremely low off-state current. Accordingly, electric charge corresponding to data written to the memory cell 51_1 can be retained in the capacitor 53 for a long time. In other words, data once written to memory cells 51_1 to 51_N can be retained for a long time. Therefore, the frequency of data refresh can be reduced, and the power consumption of the semiconductor device according to one embodiment of the present invention can be reduced.

In addition, the memory cells 51_1 to 51_N where OS transistors are used can be freely provided over a silicon substrate, an element layer including an OS transistor, or the like; thus, integration can be easily performed. Accordingly, the number of memory cells arranged per unit area can be increased, and the memory density can be increased.

The transistor 52 preferably includes a back gate electrode. Controlling a potential applied to the back gate electrode can control the threshold voltage of the transistor 52. Thus, the on-state current of the transistor 52 can be increased and the off-state current of the transistor 52 can be decreased, for example.

The element layer 40 illustrated in FIG. 2 includes transistors 41 to 44. Each of the transistors 41 to 44 can be an OS transistor and is illustrated as an n-channel transistor.

The transistor 41 is a transistor for controlling the potential of the wiring GBL to a potential corresponding to a potential of the wiring LBL in a period during which data is read from the memory cell 51_1. The transistor 42 is a transistor functioning as a switch where a selection signal MUX is input to a gate and ON or OFF between a source and a drain is controlled in accordance with the selection signal MUX. The transistor 43 is a transistor functioning as a switch where a write control signal WE is input to a gate and ON or OFF between a source and a drain is controlled in accordance with the write control signal WE. The transistor 44 is a transistor functioning as a switch where a read control signal RE is input to a gate and ON or OFF between a source and a drain is controlled in accordance with the read control signal RE. Note that the ground potential GND, which is a fixed potential, is applied to the source side of the transistor 44.

Figure 3:
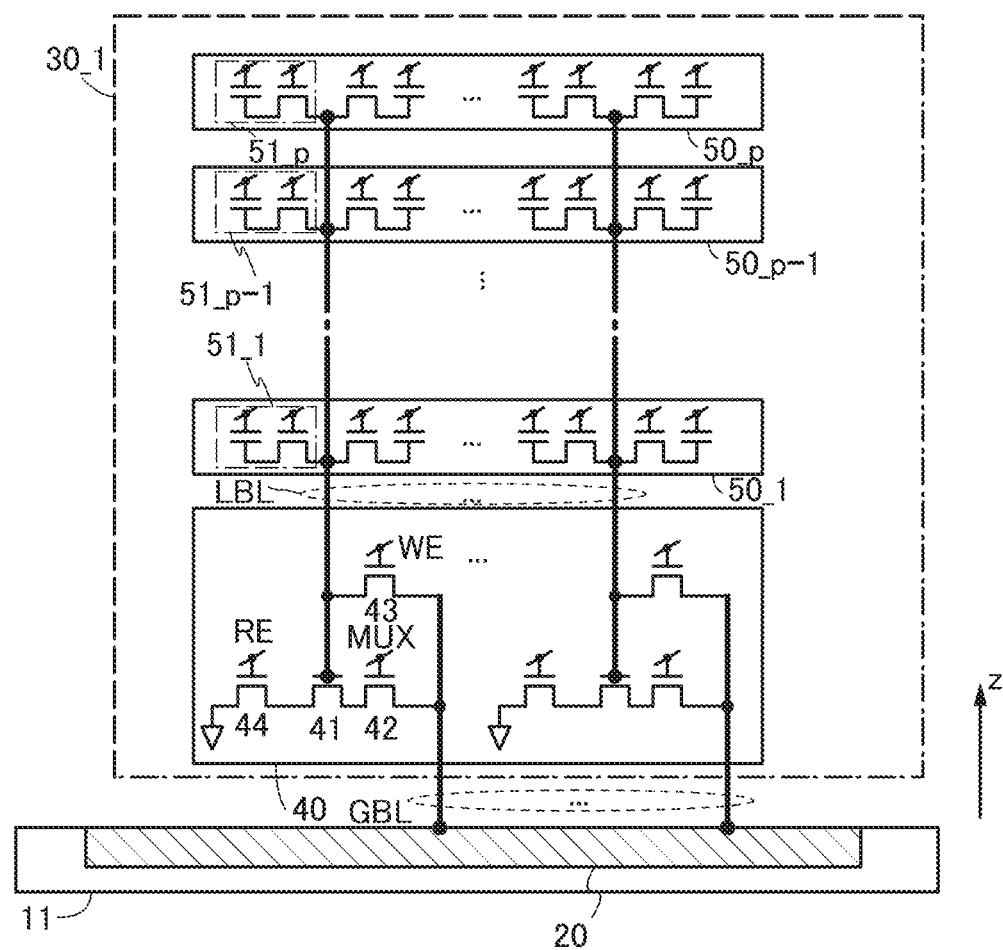
FIG. 3 is a diagram illustrating a structure example of a semiconductor device.

Note that although the element layer 50 illustrated in FIG. 2 is illustrated as a single layer, a structure where a plurality of element layers 50 are stacked may be employed. FIG. 3 illustrates this structure.

FIG. 3 is a circuit diagram of the stacked block 301 illustrating a structure example of a memory cell included in element layers 50_1 to 50_p (p is a natural number greater than or equal to 2) as a plurality of element layers 50. The element layers 50_1 to 50_p include memory cells 51_1 to 51_p (also referred to as memory cells 51) that are connected to a local bit line LBL extending in the z-axis direction. The structure enables arrangement of a plurality of memory cells per unit area and thus can increase the memory density.

Note that FIG. 3 illustrates the structure where the plurality of element layers 50_1 to 50_p are stacked in the z-axis direction as the element layer 50 and the memory cells are connected through the local bit line LBL provided in the z-axis direction; however, another structure may be employed. Another structure example is described with reference to FIG. 4A, FIG. 4B, FIG. 5, and FIG. 6.

Figure 4A:
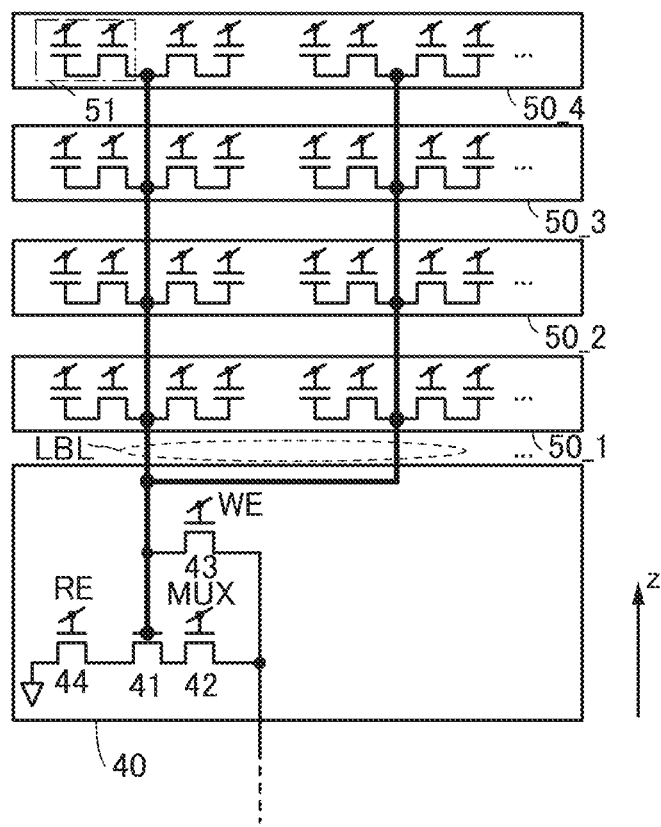
FIG. 4A and FIG. 4B are diagrams illustrating a structure example of a semiconductor device.

FIG. 4A illustrates a structure example where the transistors 41 to 44 included in the element layer 40 and four element layers 50_1 to 50_4 are provided in the z-axis direction. The element layers 501 to 50_4 each include the memory cell 51. Each memory cell 51 is connected to the gate of the transistor 41 through the local bit line LBL provided in the z-axis direction. The transistors included in the element layer 40 are the four transistors 41 to 44. In the case where memory cells are stacked and provided in four element layers as illustrated in FIG. 4A, four memory cells are provided in each of the element layers 40. A structure may be employed in which 16 memory cells are connected to the gate of the transistor 41 through the local bit line LBL.

Figure 4B:
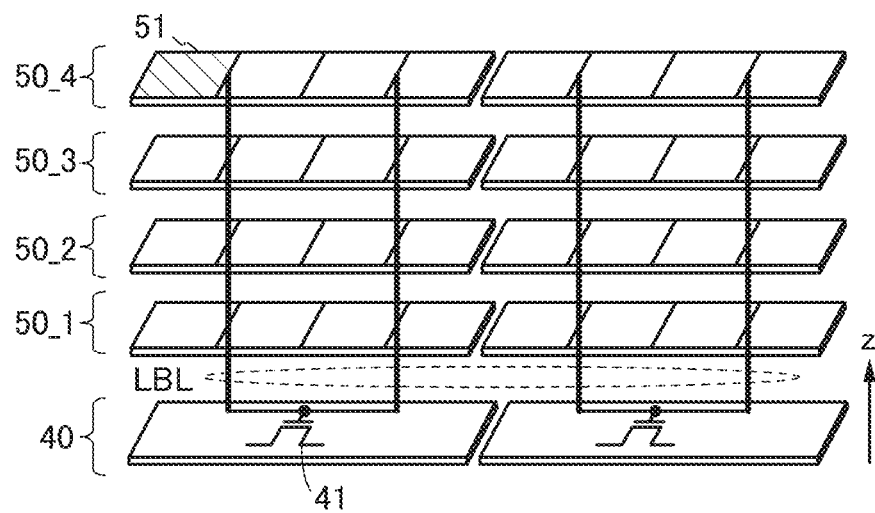

The structure in FIG. 4A can be illustrated in a schematic diagram in FIG. 4B. FIG. 4B illustrates the memory cells 51 included in the element layers 50_1 to 50_4, the local bit line LBL, and the transistor 41 included in the element layer 40.

In the structure in FIG. 4A and FIG. 4B, the memory cells can be arranged at high density; however, the transistors included in the element layer 40 also need to be arranged at high density. In the case where the structure of the transistor included in the memory cell 51 is a shape with a large number of steps for miniaturization, for example, a process for forming a gate electrode in a self-aligning manner is employed, a process with a large number of steps for miniaturization also needs to be employed for the transistors included in the element layer 40; therefore, manufacturing cost might be increased.

Therefore, the transistors included in the element layer 40 each preferably employ a process different from that for the memory cell, that is, not a transistor shape with a large number of steps for miniaturization but a transistor shape that can reduce the number of steps. In other words, when the transistors included in the element layer 40 each employ not a transistor shape that gives a high priority to miniaturization but a transistor shape that can reduce manufacturing cost, for example, when the transistor channel length and channel width, that is, the transistor size is made larger than the size of the transistor included in the memory cell 51, an increase in manufacturing cost can be suppressed.

In order that the size of the transistors included in the element layer 40 in FIG. 4A and FIG. 4B be made larger than the size of the transistors included in the memory cell 51, it is important to increase the area occupied by the element layer 40. A structure that can increase the area occupied by the element layer 40 is described with reference to FIG. 5 and FIG. 6.

Figure 5:
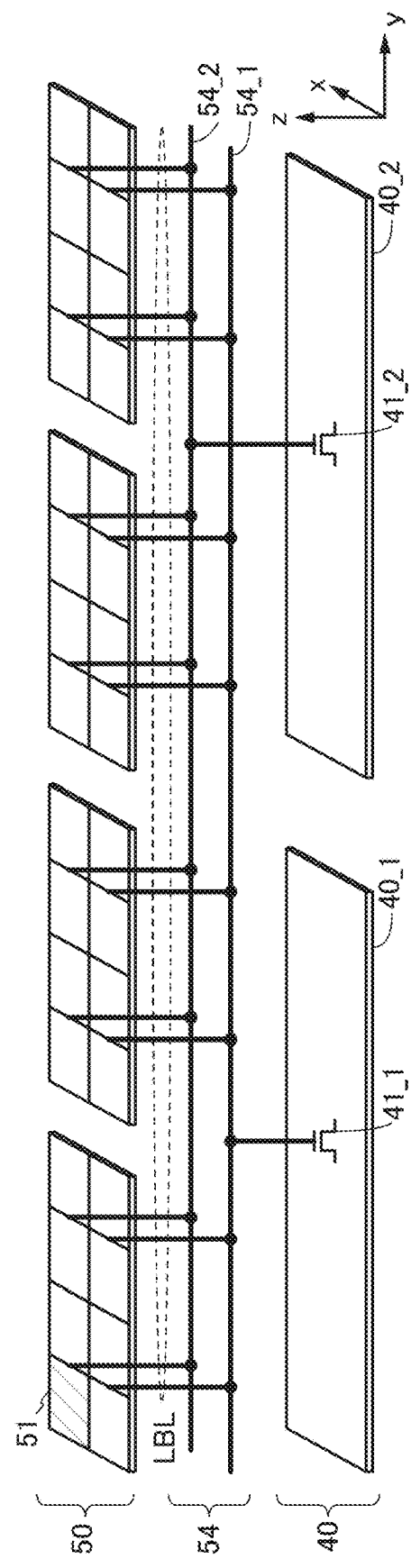
FIG. 5 is a diagram illustrating a structure example of a semiconductor device.

FIG. 5 is a schematic diagram similar to FIG. 4B and is a diagram illustrating a structure example where the area occupied by the element layer 40 can be increased. The schematic diagram illustrated in FIG. 5 illustrates a structure where a wiring layer 54 and the element layer 50 are provided over the element layer 40. The wiring layer 54 includes wirings 54_1 and 54_2 that are connected to the memory cell 51 included in the element layer 50. The wiring 54_1 is connected to a gate of a transistor 41_1 included in an element layer 40_1 of the element layer 40. The wiring 54_2 is connected to a gate of a transistor 41_2 included in an element layer 40_2 of the element layer 40.

When the wiring layer 54 is included between the element layer 40 and the element layer 50 as illustrated in FIG. 5, the area occupied by the element layer 40_1 and the element layer 402 can be made larger than the area occupied by the memory cells 51 provided in an x direction and a y direction. Accordingly, the transistors included in the element layer 40 can each have not a transistor shape that gives a high priority to miniaturization but a transistor shape that can reduce manufacturing cost, so that an increase in manufacturing cost can be suppressed.

Figure 6:
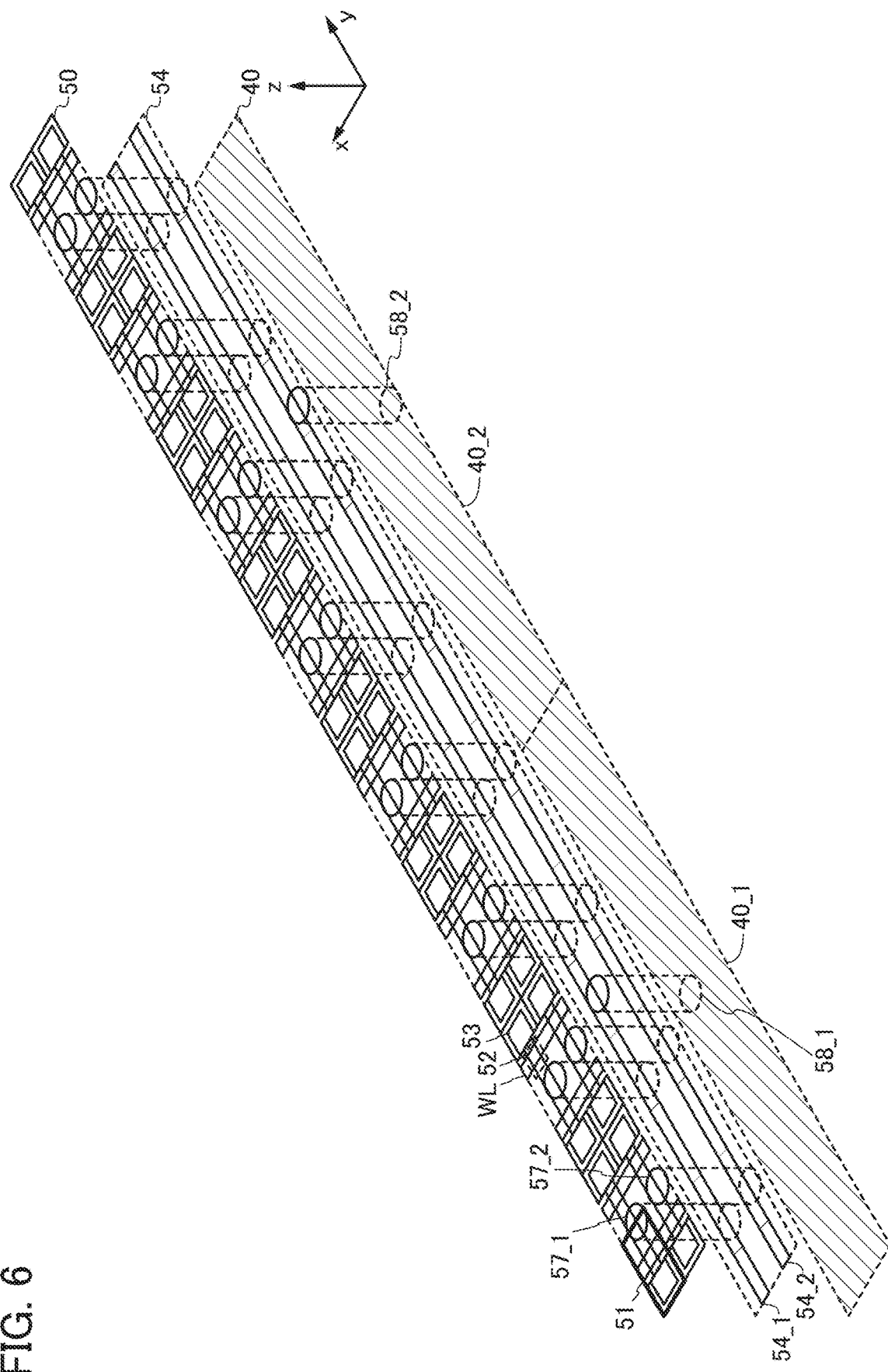
FIG. 6 is a diagram illustrating a structure example of a semiconductor device.

FIG. 6 is a diagram that visually illustrates the schematic diagram illustrated in FIG. 5 based on a memory cell layout diagram. In FIG. 6, a region surrounded by a thick line corresponds to one memory cell 51. The memory cell 51 includes the transistor 52 that is provided to overlap the word line WL and the capacitor 53 that is connected to the transistor 52. Like FIG. 5, the diagram illustrated in FIG. 6 illustrates a structure where the wiring layer 54 and the element layer 50 are provided over the element layer 40. The wiring 54_1 and the wiring 54_2 are connected to memory cells provided in a y direction through opening portions 57_1 and 57_2. The wiring 54_1 and the wiring 54_2 are connected to the element layers 40_1 and 40_2 provided in the y direction through opening portions 58_1 and 58_2.

When the wiring layer 54 is included between the element layer 40 and the element layer 50 as illustrated in FIG. 6, the area occupied by the element layer 40_1 and the element layer 402 can be made larger than the area occupied by the memory cells 51 provided in an x direction and the y direction. Accordingly, the transistors included in the element layer 40 can each have not a transistor shape that gives a high priority to miniaturization but a transistor shape that can reduce manufacturing cost, so that an increase in manufacturing cost can be suppressed.

Note that although in the element layer 50_1 illustrated in FIG. 2, the transistor and the capacitor are illustrated as being in the same layer, a structure where the transistor and the capacitor are provided in different layers may be employed. FIG. 7B illustrates this structure.

Figure 7A:
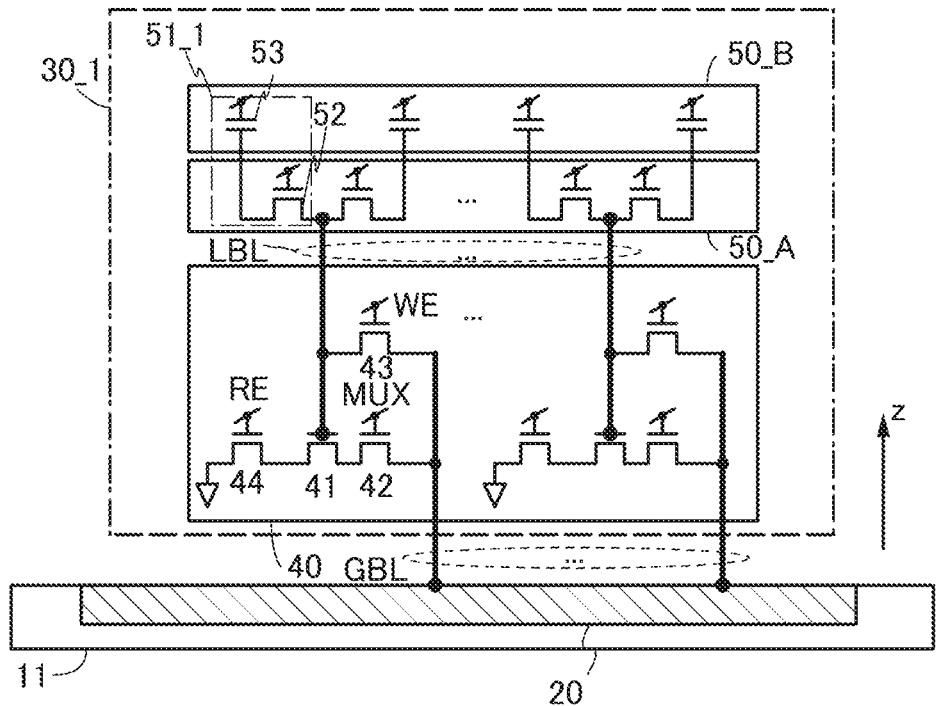
FIG. 7A and FIG. 7B are diagrams each illustrating a structure example of a semiconductor device.
Figure 7B:
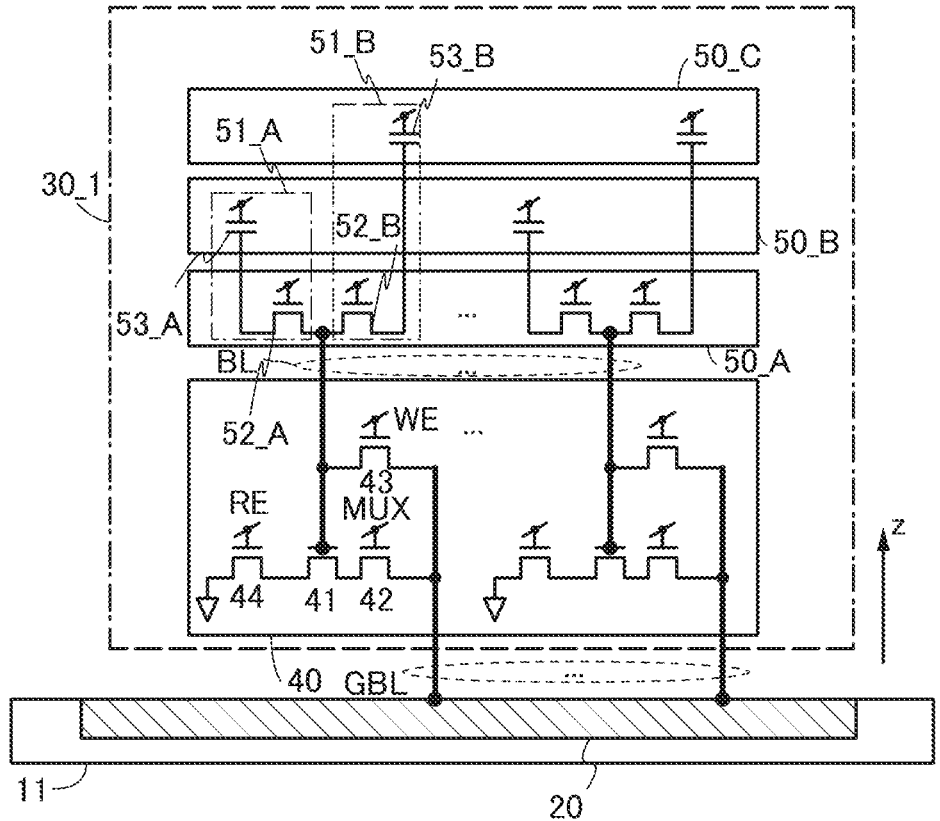

FIG. 7A is a circuit diagram of the stacked block 30_1 illustrating a structure example of the memory cell 51_1 that includes an element layer 50_A as the element layer 50 provided with the transistor 52 and an element layer 50_B as the element layer 50 provided with the capacitor 53. The element layer 50_A includes the transistor 52, and the element layer 50_B includes the capacitor 53. Compared to a structure where transistors are stacked, the structure can reduce manufacturing steps.

Note that although in the element layer 50_1 illustrated in FIG. 2, a plurality of capacitors are illustrated as being provided in the same layer, a structure where the plurality of capacitors are provided in different layers may be employed. FIG. 7B illustrates this structure.

FIG. 7B is a circuit diagram of the stacked block 30_1 illustrating a structure example of memory cells 51_A and 51_B that include the element layer 50_A as the element layer 50 provided with the transistor 52, the element layer 50_B as the element layer 50 provided with a capacitor 53_A, and an element layer 50_C as the element layer 50 provided with a capacitor 53_B. The memory cell 51_A includes a transistor 52_A provided in the element layer 50_A and the capacitor 53_A provided in the element layer 50_B. The memory cell 51_B includes a transistor 52_B provided in the element layer 50_A and the capacitor 53_B provided in the element layer 50_C. Compared to the structure where transistors are stacked, the structure can reduce manufacturing steps.

Figure 8:
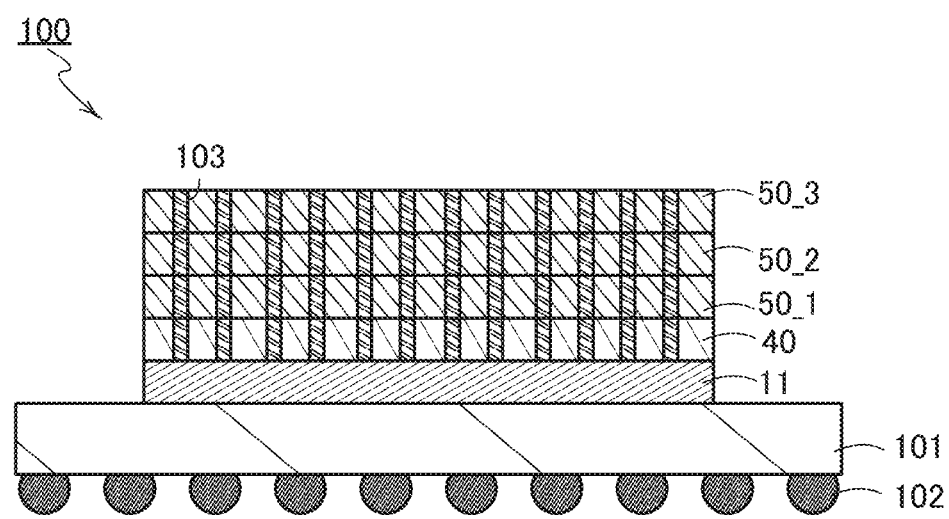
FIG. 8 is a diagram illustrating a structure example of a semiconductor device.
Figure 9A:
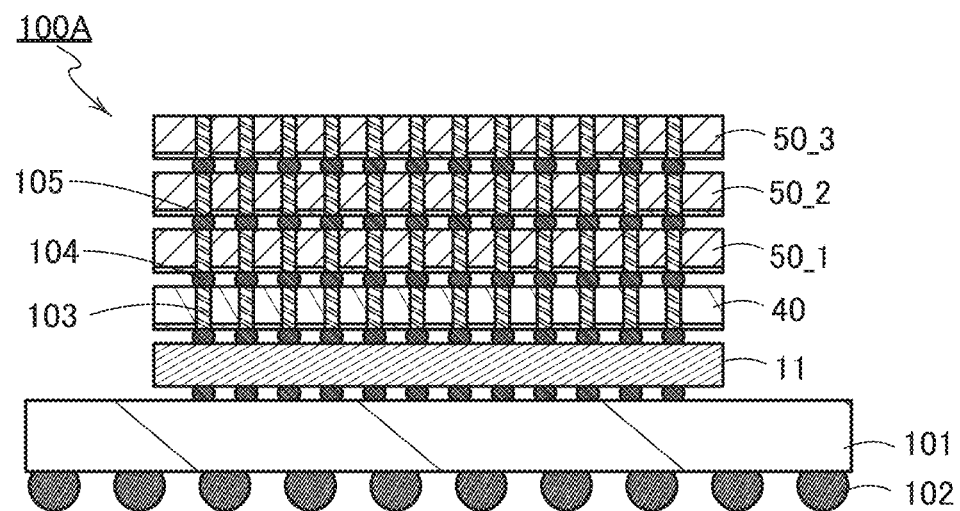
FIG. 9A and FIG. 9B are diagrams each illustrating a structure example of a semiconductor device.
Figure 9B:
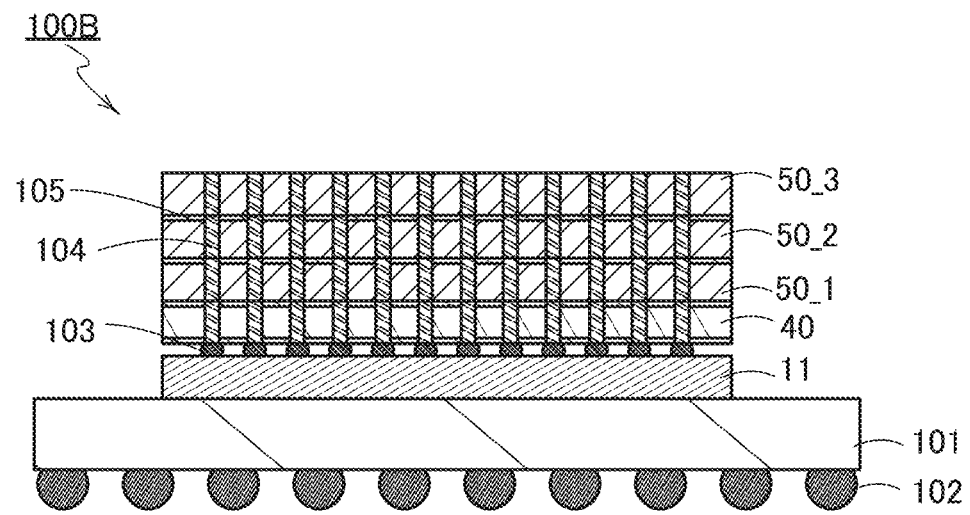

Next, an example is shown in which an integrated circuit (referred to as an IC chip) that includes the semiconductor device 10 and functions. The semiconductor device 10 can be one IC chip by mounting a plurality of dies on a packaging substrate. FIG. 8, FIG. 9A, and FIG. 9B each illustrate a structure example.

In a cross-sectional schematic diagram of an IC chip 100 illustrated in FIG. 8, a stacked block where the silicon substrate 11, the element layer 40, and the element layers 50_1 to 50_3 are stacked over a packaging substrate 101 is included. Solder balls 102 for connecting the IC chip 100 to a printed circuit board or the like are provided on the packaging substrate 101. A stacked structure of the element layer 40 and the element layers 50_1 to 50_3 can be formed by repeating structures of forming OS transistors. In addition, the peripheral circuit provided on the silicon substrate can be electrically connected to each circuit such as the memory cells included in the element layer 40 and the element layers 50_1 to 50_3 via a through electrode 103 provided to pass through each layer. A TSV (Through Silicon Via) can be used as the through electrode 103.

In a cross-sectional schematic diagram of an IC chip 100A illustrated in FIG. 9A as another example, a stacked block where the silicon substrate 11, the element layer 40, and the element layers 50_1 to 50_3 are stacked over the packaging substrate 101 is included. The peripheral circuit provided on the silicon substrate is attached to each circuit such as the memory cells included in the element layer 40 and the element layers 50_1 to 50_3 by using a silicon substrate 105. In addition, the layers can be electrically connected to each other via the through electrode 103 provided to pass through each layer and a metal bump 104 provided between the layers.

In a cross-sectional schematic diagram of an IC chip 100B illustrated in FIG. 9B as another example, a stacked block where the silicon substrate 11, the element layer 40, and the element layers 50_1 to 50_3 are stacked over the packaging substrate 101 is included. The peripheral circuit provided on the silicon substrate is attached to each circuit such as the memory cells included in the element layer 40 and the element layers 50_1 to 50_3 by using the silicon substrate 105. In addition, the layers can be electrically connected to each other via the through electrode 103 provided to pass through each layer and the metal bump 104 provided between the layers.

Figure 10:
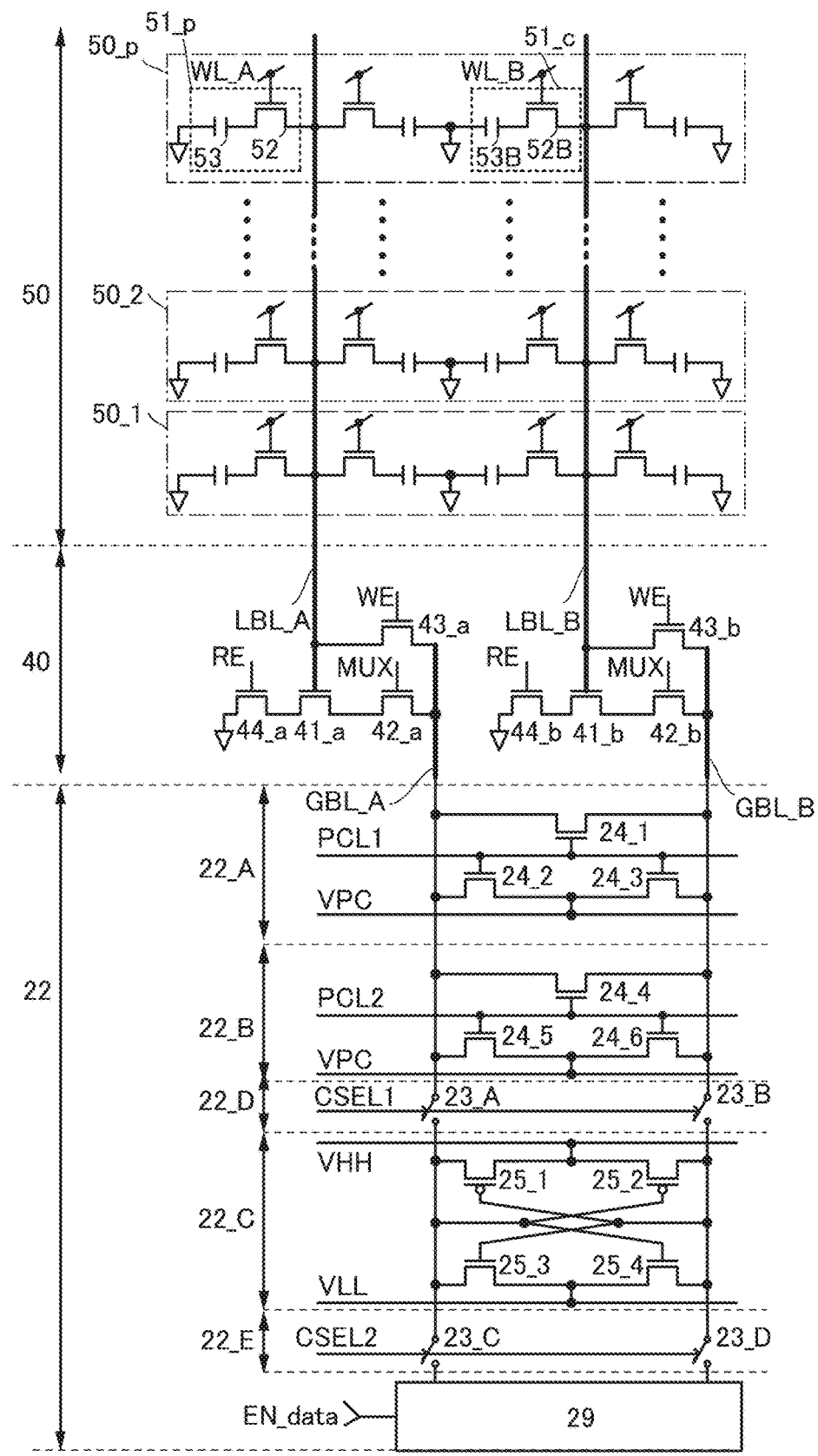
FIG. 10 is a diagram illustrating a structure example of a semiconductor device.

FIG. 10 is a circuit diagram illustrating the circuit structure example of the memory cell 51 included in the element layer 50 described in FIG. 3 and a specific circuit structure example of a peripheral circuit 22 connected to the memory cell.

FIG. 10 illustrates the element layers 50_1 to 50_p. In FIG. 10, the memory cell 51_p is illustrated as a memory cell of the element layer 50_p connected to a wiring LBL_A. In the memory cell 51p, the transistor 52 whose gate is connected to a word line WL_A and the capacitor 53 are illustrated. In addition, in FIG. 10, a memory cell 51_c is illustrated as a memory cell of the element layer 50_p connected to a wiring LBL_B. In the memory cell 51_c, a transistor 52B whose gate is connected to a word line WL_B and a capacitor 53B are illustrated.

FIG. 10 illustrates the element layer 40 that includes transistors 41_a, 41_b, 42_a, 42_b, 43_a, 43_b, 44_a, and 44_b. The wirings LBL_A and LBL_B are connected to gates of the transistors 41_a and 41_b.

In addition, as illustrated in FIG. 10, wirings GBL_A and GBL_B are connected to the transistors 42_a, 42_b, 43_a, and 43_b included in the element layer 40. The wirings GBL_A and GBL_B are connected to transistors included in the peripheral circuit 22. Furthermore, as illustrated in FIG. 10, control signals WE, RE, and MUX are supplied to gates of the transistors 42_a, 42_b, 43_a, 43_b, 44_a, and 44_b included in the element layer 40.

In addition, in FIG. 10, a precharge circuit 22_A, a precharge circuit 22_B, a sense amplifier 22_C, a switch circuit 22_D, a switch circuit 22_E, and a write read circuit 29 that are positioned on the silicon substrate side are illustrated as circuits included in the peripheral circuit 22. Transistors included in the precharge circuit 22_A, the precharge circuit 22_B, and the sense amplifier 22_C are Si transistors. Switches 23_A to 23_D included in the switch circuit 22_D and the switch circuit 22_E can also be Si transistors. Either sources or drains of the transistors 42_a, 42_b, 43_a, and 43_b are connected to the transistors included in the precharge circuit 22_A, the precharge circuit 22_B, the sense amplifier 22_C, and the switch circuit 22_D.

The precharge circuit 22_A is formed using n-channel transistors 24_1 to 24_3. The precharge circuit 22_A is a circuit for precharging the wirings LBL_A and LBL_B with an intermediate potential VPC corresponding to a potential VDD/2 between VDD and VSS in accordance with a precharge signal supplied to a precharge line PCL1.

The precharge circuit 22_B is formed using n-channel transistors 24_4 to 24_6. The precharge circuit 22_B is a circuit for precharging the wiring GBL_A and the wiring GBL_B with the intermediate potential VPC corresponding to the potential VDD/2 between VDD and VSS in accordance with a precharge signal supplied to a precharge line PCL2.

The sense amplifier 22_C is formed using p-channel transistors 25_1 and 25_2 and n-channel transistors 25_3 and 25_4 that are connected to a wiring VHH and a wiring VLL, respectively. The wiring VHH and the wiring VLL are wirings having a function of applying VDD and VSS, respectively. The transistors 25_1 to 25_4 are transistors that form an inverter loop. In memory cells 31_N_A and 31_N_B, when the word lines WL_A and WL_B are selected as high levels, potentials of the precharged wirings LBL_A and LBL_B are changed, and potentials of the wiring GBL_A and the wiring GBL_B are set to high supply potentials VDD or low supply potentials VSS in accordance with the change. The potentials of the wiring GBL_A and the wiring GBL_B can be output to the outside through the switch circuit 22_D and the switch circuit 22_E and through the write read circuit 29. The wirings LBL_A and LBL_B and the wiring GBL_A and the wiring GBL_B each correspond to a bit line pair. Data signal writing of a write/read circuit 25 is controlled in accordance with a signal EN_data.

The switch circuit 22_D is a circuit for controlling the conduction state between the sense amplifier 22_C and each of the wiring GBL_A and the wiring GBL_B. The on and off of the switch circuit 22_D are switched under the control of a switch signal CSEL1. In the case where the switches 23_A and 23_B are n-channel transistors, the switches 23_A and 23_B are turned on when the switch signal CSEL1 is at a high level and the switches 23_A and 23_B are turned off when the switch signal CSEL1 is at a low level. The switch circuit 22_E is a circuit for controlling the conduction state between the write read circuit 29 and the bit line pair connected to the sense amplifier 22_C. The on and off of the switch circuit 22_D are switched under the control of the switch signal CSEL1. The switches 23_C and 23_D may switch between on and off in a manner similar to that of the switches 23_A and 23_B.

Figure 11:
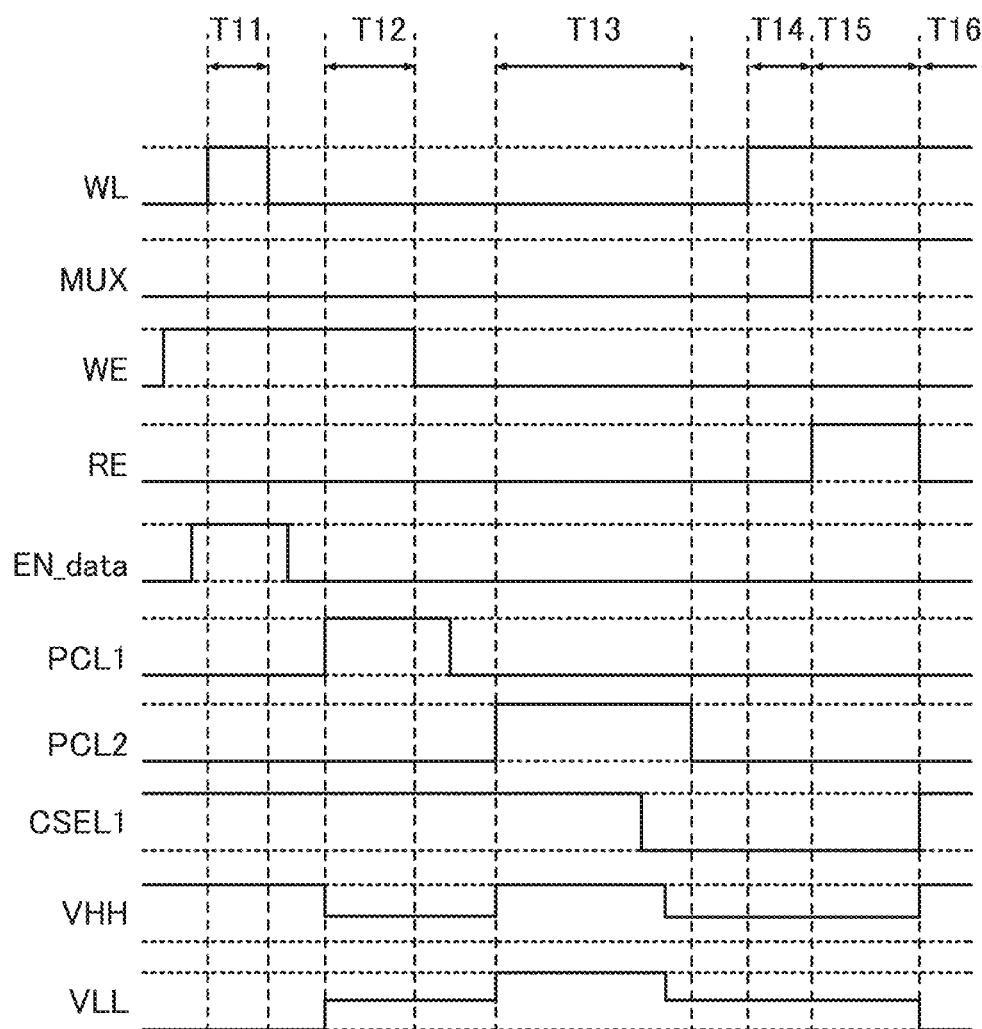
FIG. 11 is a diagram illustrating a structure example of a semiconductor device.

In addition, FIG. 11 shows a timing chart for describing the operation of the circuit diagram illustrated in FIG. 10. In the timing chart shown in FIG. 11, a period T11 corresponds to a period for describing write operation, a period T12 corresponds to a period for describing precharge operation of the wiring LBL, a period T13 corresponds to a period for describing precharge operation of the wiring GBL, a period T14 corresponds to a period for describing charge sharing operation, a period T15 corresponds to a period for describing standby operation for reading, and a period T16 corresponds to a period for describing read operation.

In the period T11, a word line connected to the gate of the transistor included in the memory cell to which the data signal is to be written is set to a high level. At this time, the control signal WE and the signal EN_data are set to a high level, and the data signal is written to the memory cell through the wiring GBL and the bit line BL.

In the period T12, in order to precharge the wiring LBL, the precharge line PCL1 is set to a high level in a state where the control signal WE is at a high level. The bit line BL is precharged with a precharge potential. In the period T12, the wiring VHH and the wiring VLL through which power supply voltage is supplied to the sense amplifier 22_C are both preferably set to VDD/2 in order to suppress power consumption due to flow-through current.

In the period T13, in order to precharge the wiring GBL, the precharge line PCL2 is set to a high level. The wiring GBL is precharged with a precharge potential. In the period T13, the wiring VHH and the wiring VLL are both set to VDD, so that the wiring GBL with a large load can be precharged in a short time.

In the period T14, in order to cause charge sharing for balancing electric charge with which the bit line BL and the wiring GBL are precharged, the control signal WL and the control signal MUX are set to a high level. The bit line BL and the wiring GBL have an equal potential. In the period T14, the wiring VHH and the wiring VLL through which power supply voltage is supplied to the sense amplifier 22_C are both preferably set to VDD/2 in order to suppress power consumption due to flow-through current.

In the period T15, the control signal RE is set to a high level. The period T15 is a period during which current flows through the transistor 41 in accordance with the potential of the bit line BL and the potential of the wiring GBL varies in accordance with the current amount. The switch signal CSEL1 is set to a low level so that the variation in the potential of the wiring GBL is not affected by the sense amplifier 22_C. The wiring VHH or the wiring VLL is similar to that in the period T14.

In the period T16, the switch signal CSEL1 is set to a high level and the variation in the potential of the wiring GBL is amplified by the bit line pair connected to the sense amplifier 22_C; thus, the data signal written to the memory cell is read.

In the semiconductor device according to one embodiment of the present invention, an OS transistor with extremely low off-state current is used as the transistor provided in each element layer. OS transistors can be stacked and provided over a silicon substrate where Si transistors are provided. Therefore, OS transistors can be manufactured in the perpendicular direction by repeating the same manufacturing process, and manufacturing cost can be reduced. Furthermore, in one embodiment of the present invention, the memory density can be increased by arranging the transistors included in the memory cell in not a plane direction but the perpendicular direction, so that the device can be downsized.

Furthermore, in one embodiment of the present invention, the wiring LBL is connected to the gate of the transistor 41, so that data can be read using a slight potential difference of the wiring LBL. Since the circuit such as the sense amplifier formed using Si transistors can be downsized, the semiconductor device can be downsized. Moreover, even when the capacitance of the capacitors included in the memory cells is reduced, operation is possible.

One embodiment of the present invention uses an OS transistor with extremely low off-state current as a transistor provided in each element layer. Accordingly, the frequency of refresh of data retained in the memory cell can be reduced, and a semiconductor device with reduced power consumption can be obtained. OS transistors can be stacked and provided and can be manufactured in the perpendicular direction by employing the same manufacturing process repeatedly, which can reduce manufacturing cost. Furthermore, in one embodiment of the present invention, the memory density can be increased by arranging the transistors included in the memory cell in not the plane direction but the perpendicular direction, so that the device can be downsized. Moreover, since an OS transistor has a smaller variation in electrical characteristics than a Si transistor even in a high-temperature environment, the semiconductor device can function as a highly reliable memory device in which stacked and integrated transistors have a small variation in electrical characteristics.

Embodiment 2

Figure 12:
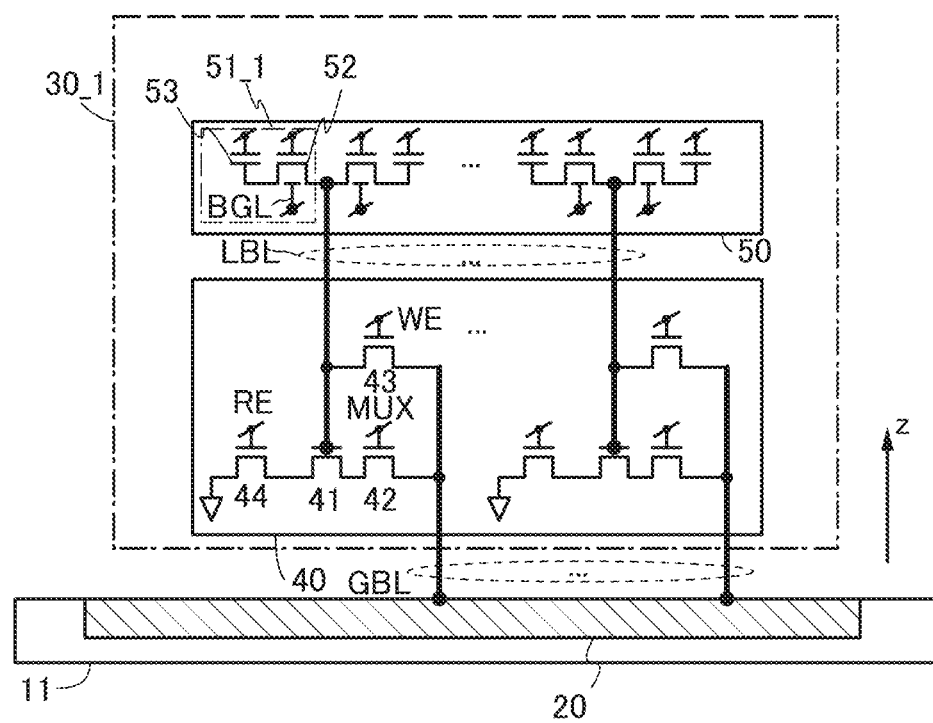
FIG. 12 is a diagram illustrating a structure example of a semiconductor device.

In this embodiment, a modification example of a circuit applicable to the semiconductor device described in Embodiment 1 is described with reference to FIG. 12.

In the memory cells included in the above-described element layers 50, the illustrated transistors each have a top-gate structure or a bottom-gate structure without a back gate electrode; however, the structure of the transistors 52 is not limited thereto. For example, as illustrated in FIG. 12, the transistors included in the memory cells 51 may each be the transistor 52 that has a back gate electrode connected to a back gate electrode line BGL. With the structure of FIG. 12, electrical characteristics such as the threshold voltage of the transistors 52 can be easily controlled from the outside.

Embodiment 3

An example of a semiconductor device functioning as a memory device according to one embodiment of the present invention will be described below.

Figure 13:
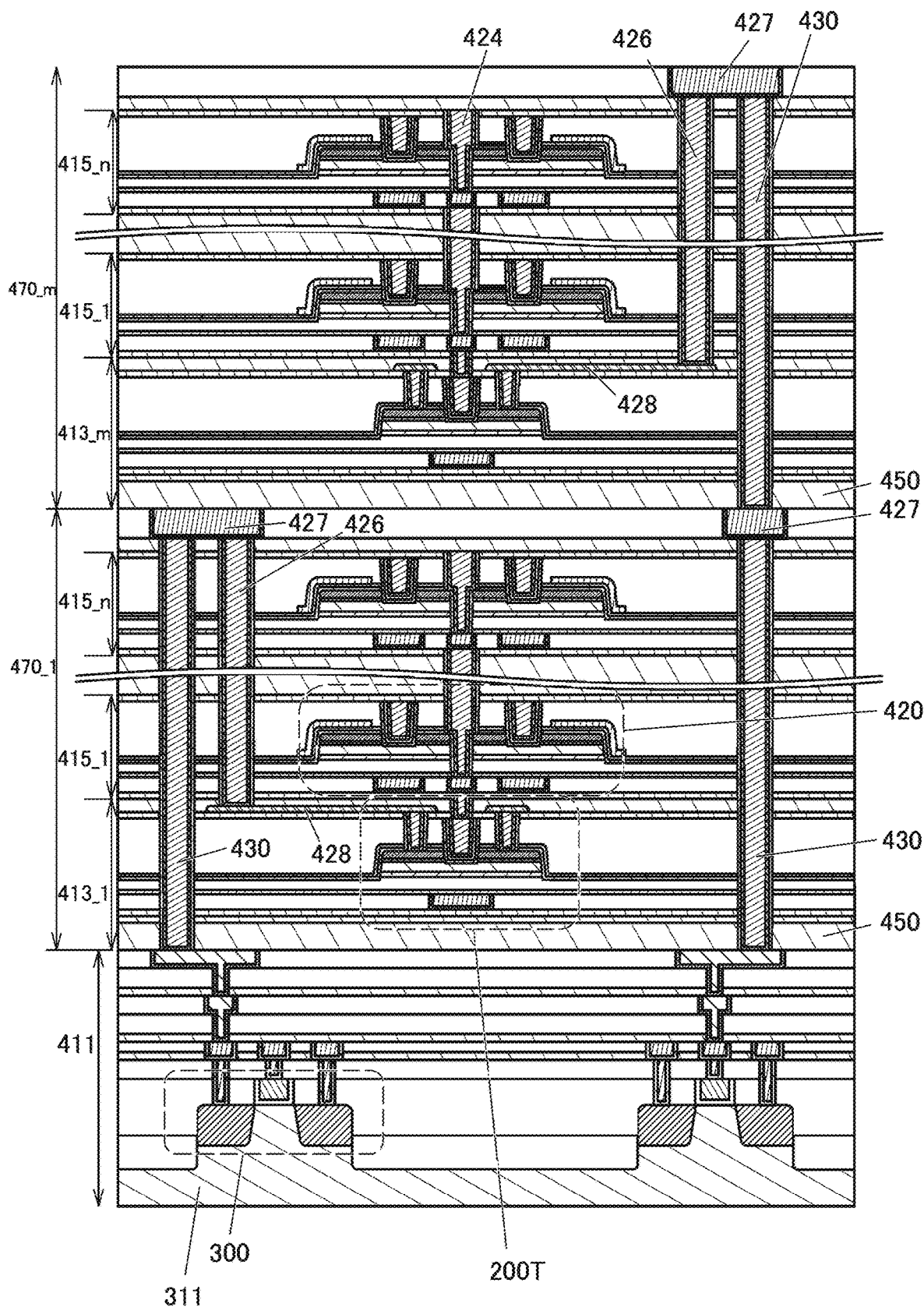
FIG. 13 is a schematic cross-sectional view showing a structure example of a semiconductor device.

FIG. 13 is a diagram showing an example of a semiconductor device in which memory units 470 (a memory unit 470_1 to a memory unit 470_m: m is a natural number greater than or equal to 2, and the case of m=2 is shown in FIG. 13) are stacked and provided over an element layer 411 including a circuit provided on a semiconductor substrate 311. FIG. 13 shows the element layer 411 and the plurality of memory units 470 stacked over the element layer 411. An example is shown in which the plurality of memory units 470 are each provided with a 20 transistor layer 413 (a transistor layer 413_1 to a transistor layer 413_m) corresponding to each memory unit 470 on a substrate 450 and a plurality of memory device layers 415 (a memory device layer 415_1 to a memory device layer 415_n: n is a natural number greater than or equal to 2) over each transistor layer 413. Note that although the example is shown in which the transistor layer 413 is provided on the substrate 450 and the memory device layers 415 are provided over the transistor layer 413 in each memory unit 470, this embodiment is not limited thereto. The plurality of memory device layers 415 may be provided on the substrate 450 and the transistor layers 413 may be provided over the plurality of memory device layers 415, or the memory device layers 415 may be provided on the substrate 450 and over and under the transistor layers 413.

As each of materials included in the semiconductor substrate 311 and the substrate 450, a material selected from Si, Ge, SiGe, GaAs, GaAlAs, GaN, and InP can be used.

The element layer 411 includes a transistor 300 provided on the semiconductor substrate 311 and can function as a circuit (referred to as a peripheral circuit in some cases) of the semiconductor device. Examples of the circuit include a column driver, a row driver, a column decoder, a row decoder, a sense amplifier, a precharge circuit, an amplifier circuit, a word line driver circuit, an output circuit, a control logic circuit, and the like.

The transistor layer 413 includes a transistor 200T and can function as a circuit that controls each memory unit 470. The memory device layer 415 includes a memory device 420. The memory device 420 described in this embodiment includes a transistor and a capacitor.

Note that although not particularly limited, m described above is greater than or equal to 2 and less than or equal to 100, preferably greater than or equal to 2 and less than or equal to 50, further preferably greater than or equal to 2 and less than or equal to 10. In addition, although not particularly limited, n described above is greater than or equal to 2 and less than or equal to 100, preferably greater than or equal to 2 and less than or equal to 50, further preferably greater than or equal to 2 and less than or equal to 10. Furthermore, the product of m and n described above is greater than or equal to 4 and less than or equal to 256, preferably greater than or equal to 4 and less than or equal to 128, further preferably greater than or equal to 4 and less than or equal to 64.

In addition, FIG. 13 shows a cross-sectional view in the channel length direction of the transistor 200T included in the memory unit and the transistor included in the memory device 420.

As shown in FIG. 13, the transistor 300 is provided on the semiconductor substrate 311, and the transistor layers 413 and the memory device layers 415 included in the memory units 470 are provided over the transistor 300. In one memory unit 470, the transistor 200T included in the transistor layer 413 and the memory devices 420 included in the memory device layers 415 are electrically connected to each other by a plurality of conductors 424, and the transistor 300 and the transistor 200T included in the transistor layer 413 in each memory unit 470 are electrically connected to each other by a conductor 426, a conductor 427, and a conductor 430. In addition, the conductor 426 is preferably electrically connected to the transistor 200T through a conductor 428 that is electrically connected to any one of a source, a drain, and a gate of the transistor 200T. The conductor 424 is preferably provided in each layer in the memory device layer 415. The conductor 427 is provided as an uppermost layer of each memory unit 470 and is electrically connected to the conductor 426 and the conductor 430.

As each of materials included in the conductor 426, the conductor 427, and the conductor 430, a material selected from Cu, W, Ti, Ta, and Al can be used.

Figure 14:
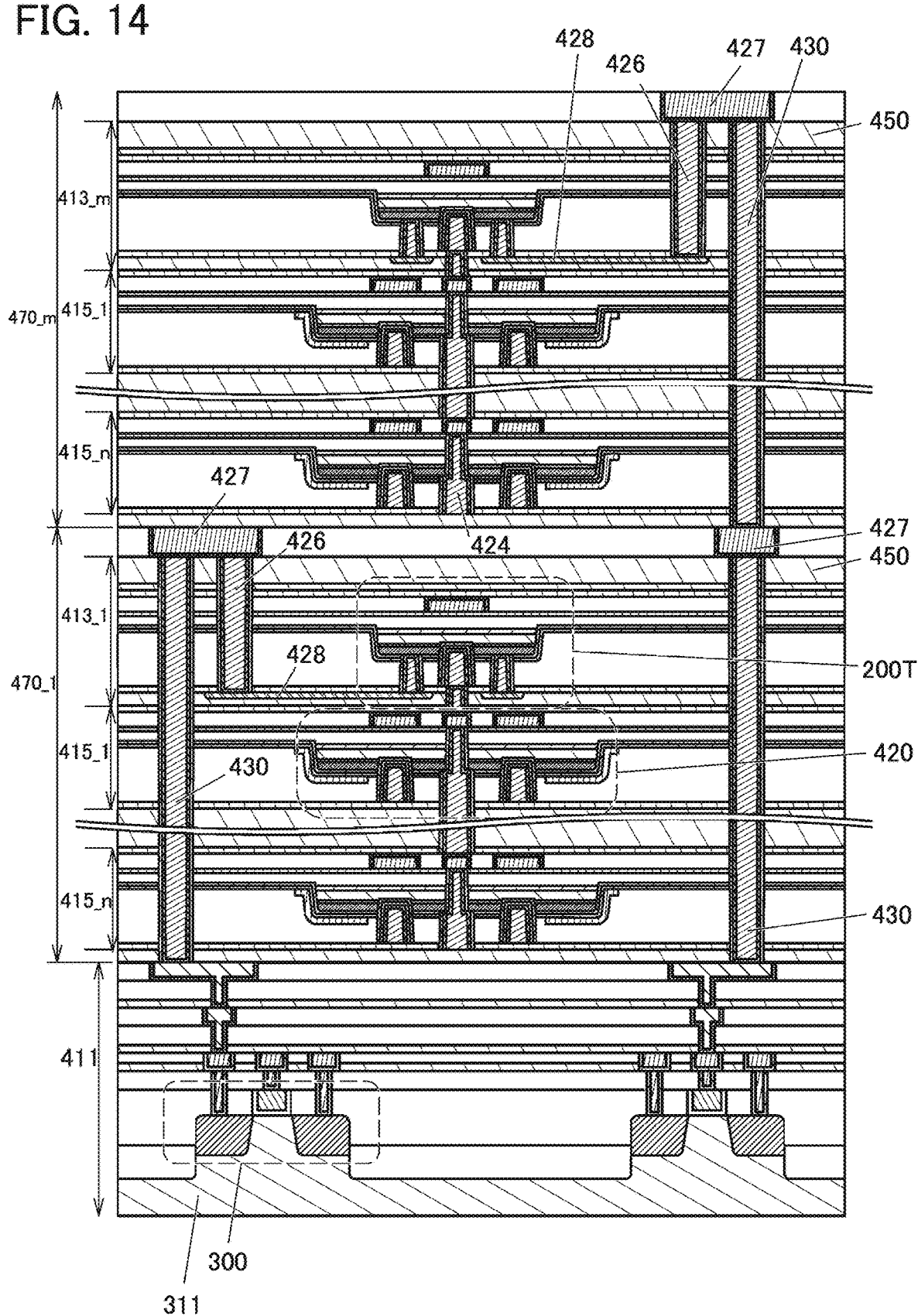
FIG. 14 is a schematic cross-sectional view showing a structure example of a semiconductor device.

Note that although FIG. 13 shows the example in which the substrate 450 of the memory unit 470 is provided on the transistor 300 side, this embodiment is not limited thereto. As shown in FIG. 14, the memory unit 470 may be provided such that the memory device layer 415 is provided on the transistor 300 side.

In FIG. 13, the conductor 426 is provided to pass through the memory device layer 415, and the conductor 430 is provided to pass through the memory device layer 415, the transistor layer 413, and the substrate 450.

In contrast, in FIG. 14, the conductor 426 is provided to pass through the substrate 450 and the transistor layer 413, and the conductor 430 is provided to pass through the substrate 450, the transistor layer 413, and the memory device layer 415.

In order to suppress leakage between the conductor 426 and the conductor 430, each side surface of the conductor 426 and the conductor 430 is preferably provided with an insulator.

In addition, although the details are described later, an insulator that inhibits passage of impurities such as water or hydrogen, or oxygen is preferably provided on each of a side surface of the conductor 424 and a side surface of the conductor 426. For such an insulator, for example, silicon nitride, aluminum oxide, or silicon nitride oxide is used.

The memory device 420 includes the transistor and the capacitor on a side surface of the transistor, and the transistor can have a structure similar to that of the transistor 200T included in the transistor layer 413.

Here, in the transistor 200T, a metal oxide functioning as an oxide semiconductor (hereinafter also referred to as an oxide semiconductor) is preferably used for a semiconductor that includes a region where a channel is formed (hereinafter also referred to as a channel formation region).

As the oxide semiconductor, for example, a metal oxide such as an In-M-Zn oxide (the element M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Alternatively, as the oxide semiconductor, indium oxide, an In—Ga oxide, or an In—Zn oxide may be used. Note that when an oxide semiconductor having a high proportion of indium is used, the on-state current, field-effect mobility, or the like of the transistor can be increased.

The transistor 200T using an oxide semiconductor in its channel formation region has extremely low leakage current in a non-conduction state; thus, a semiconductor device with low power consumption can be provided. In addition, an oxide semiconductor can be deposited by a sputtering method or the like and thus can be used in the transistor 200T included in a highly integrated semiconductor device.

In contrast, a transistor using an oxide semiconductor easily has normally-on characteristics (characteristics such that a channel exists without voltage application to a gate electrode and current flows through a transistor) owing to an impurity and an oxygen vacancy (Vo) in the oxide semiconductor that change electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Note that examples of impurities in the oxide semiconductor include hydrogen, nitrogen, alkali metal, alkaline earth metal, iron, nickel, silicon, and the like.

In particular, hydrogen as an impurity that is contained in the oxide semiconductor might form an oxygen vacancy in the oxide semiconductor. In addition, in some cases, a defect that is an oxygen vacancy into which hydrogen enters (hereinafter sometimes referred to as VoH) generates an electron serving as a carrier. Furthermore, in other cases, reaction between part of hydrogen and oxygen bonded to a metal atom generates an electron serving as a carrier.

Thus, a transistor using an oxide semiconductor with a high hydrogen content is likely to be normally on. In addition, hydrogen in the oxide semiconductor is easily transferred by stress such as heat or an electric field; thus, a high hydrogen content in the oxide semiconductor might decrease the reliability of the transistor.

Therefore, it is preferable to use a highly purified intrinsic oxide semiconductor in which impurities such as hydrogen and oxygen vacancies are reduced as the oxide semiconductor used in the transistor 200T.

The structure described in this embodiment can be used in an appropriate combination with the structures described in the other embodiments and the like.

Embodiment 4

In this embodiment, a metal oxide (hereinafter also referred to as an oxide semiconductor) that can be used in the OS transistor described in the above embodiment will be described.

A metal oxide preferably contains at least indium or zinc. In particular, indium and zinc are preferably contained. In addition, in addition to these, one kind or a plurality of kinds selected from aluminum, gallium, yttrium, tin, and the like are preferably contained. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained. For example, a metal oxide containing indium, zinc, and gallium (an In—Ga—Zn-based oxide), a metal oxide containing indium, zinc, and tin (an In—Sn—Zn-based oxide), a metal oxide containing indium, zinc, gallium, and tin (an In—Ga—Zn—Sn-based oxide), or the like can be suitably used.

<Classification of Crystal Structures>

First, the classification of the crystal structures of an oxide semiconductor is described using FIG. 15A. FIG. 15A is a diagram showing the classification of crystal structures of an oxide semiconductor, typically IGZO (a metal oxide containing In, Ga, and Zn).

As shown in FIG. 15A, an oxide semiconductor is roughly classified into "Amorphous," "Crystalline," and "Crystal." In addition, the term "Amorphous" includes completely amorphous. Furthermore, the term "Crystalline" includes CAAC (c-axis-aligned crystalline), nc (nanocrystalline), and CAC (cloud-aligned composite) (excluding single crystal and poly crystal). Note that in the classification of "Crystalline," single crystal, poly crystal, and completely amorphous are excluded. Moreover, the term "Crystal" includes single crystal and poly crystal.

Note that the structures in the thick frame shown in FIG. 15A are in an intermediate state between "Amorphous" and "Crystal," and belong to a new boundary region (new crystalline phase). In other words, these structures can be rephrased as structures completely different from "Amorphous," which is energetically unstable, and "Crystal."

Note that a crystal structure of a film or a substrate can be evaluated with an X-Ray Diffraction (XRD) spectrum. Here, FIG. 15B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 15B and obtained by GIXD measurement is hereinafter simply referred to as an XRD spectrum. Note that the CAAC-IGZO film shown in FIG. 15B has a composition in the vicinity of In:Ga:Zn=4:2:3 [atomic ratio]. In addition, the thickness of the CAAC-IGZO film shown in FIG. 15B is 500 nm.

As shown in FIG. 15B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. Note that as shown in FIG. 15B, the peak at 2θ of around 31° is asymmetric with respect to the axis of an angle at which peak intensity is detected.

A crystal structure of a film or a substrate can also be evaluated with a diffraction pattern observed by a nanobeam electron diffraction (NBED) method (such a pattern is also referred to as a nanobeam electron diffraction pattern). FIG. 15C shows a diffraction pattern of the CAAC-IGZO film. FIG. 15C shows a diffraction pattern observed by NBED in which an electron beam is incident in a direction parallel to the substrate. Note that the CAAC-IGZO film shown in FIG. 15C has a composition in the vicinity of In:Ga:Zn=4:2:3 [atomic ratio]. In addition, in the nanobeam electron diffraction method, electron diffraction is performed with a probe diameter of 1 nm.

As shown in FIG. 15C, a plurality of spots indicating c-axis alignment are observed in the diffraction pattern of the CAAC-IGZO film.

<<Structure of Oxide Semiconductor>>

Note that oxide semiconductors might be classified in a manner different from that in FIG. 15A when classified in terms of the crystal structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductor include a polycrystalline oxide semiconductor, an amorphous-like oxide semiconductor (a-like OS), an amorphous oxide semiconductor, and the like.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In addition, in an In-M-Zn oxide (the element M is one kind or a plurality of kinds selected from aluminum, gallium, yttrium, tin, titanium, and the like), the CAAC-OS tends to have a layer-shaped crystal structure (also referred to as a layer-shaped structure) in which a layer containing indium (In) and oxygen (hereinafter an In layer) and a layer containing the element M, zinc (Zn), and oxygen (hereinafter an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layer-shaped structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) might change depending on the kind, composition, or the like of the metal element contained in the CAAC-OS.

In addition, for example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS has a void or a low-density region.

That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. In addition, the second region includes gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

Oxide semiconductors have various structures and each have different properties. Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.

<Transistor Including Oxide Semiconductor>

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

In addition, a highly purified intrinsic or substantially highly purified intrinsic oxide semiconductor film has a low density of defect states and accordingly has a low density of trap states in some cases.

In addition, electric charge captured by the trap states in an oxide semiconductor takes a long time to disappear and might behave like fixed electric charge. Thus, a transistor whose channel formation region is formed in an oxide semiconductor having a high density of trap states has unstable electrical characteristics in some cases.

Accordingly, in order to stabilize electrical characteristics of the transistor, reducing the concentration in the oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor that is obtained by SIMS is lower than or equal to $1\times10^{18}$ atoms/cm$^3$, preferably lower than or equal to $2\times10^{16}$ atoms/cm$^3$.

In addition, an oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor that is obtained by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen reacts with oxygen bonded to a metal atom and generates an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with the other embodiments described in this specification as appropriate.

Embodiment 5

In this embodiment, details of a memory cell array including the memory cell 51 in the semiconductor device 10 described in Embodiment 1 and the peripheral circuit 20 including circuits for driving the memory cell array will be described.

Figure 16:
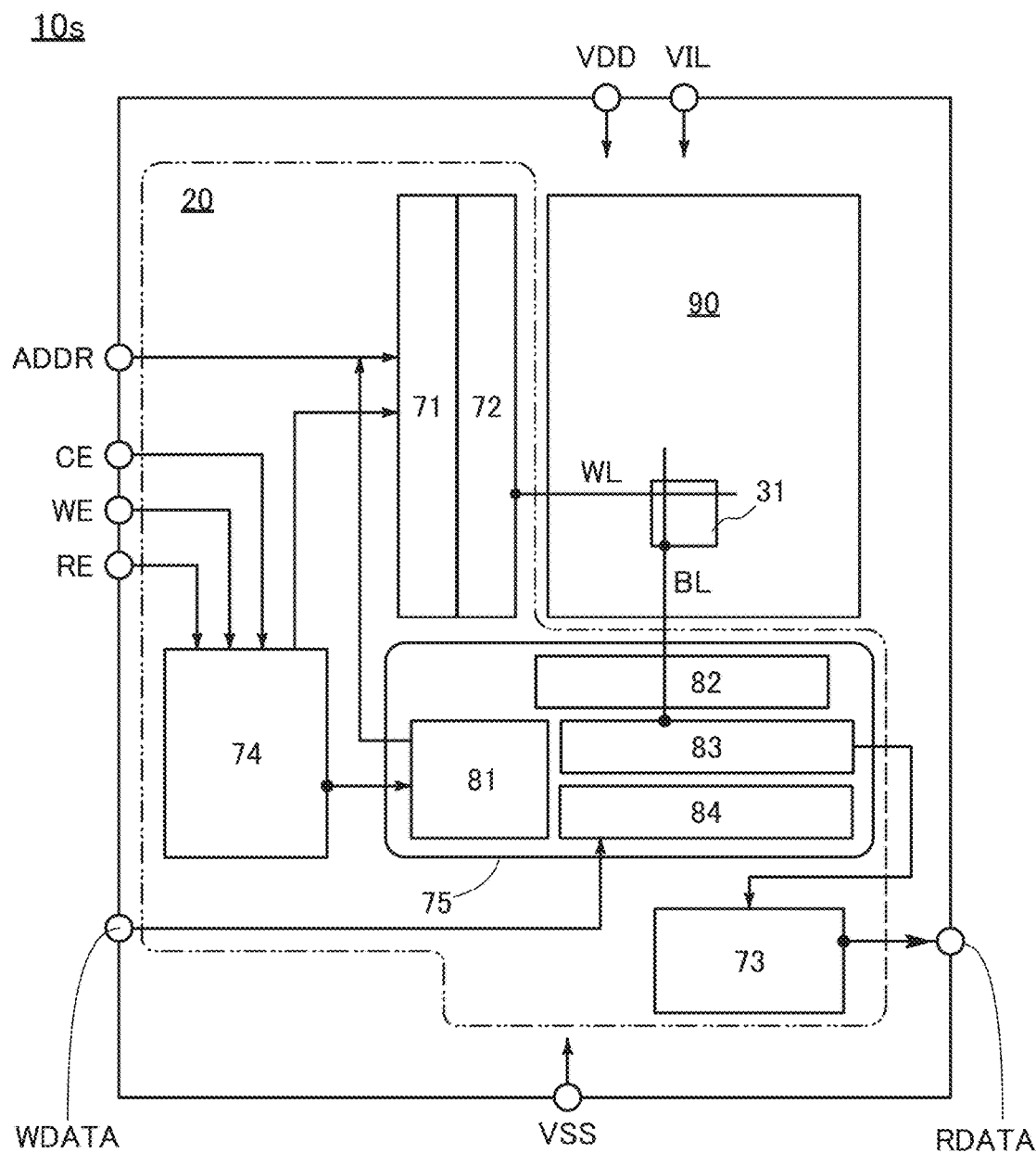
FIG. 16 is a block diagram illustrating a structure example of a semiconductor device.

FIG. 16 is a block diagram illustrating a structure example of a semiconductor device functioning as a memory device. A semiconductor device 10s includes the peripheral circuit 20 and a memory cell array 90. The peripheral circuit 20 includes a row decoder 71, a word line driver circuit 72, a column driver 75, an output circuit 73, and a control logic circuit 74.

The column driver 75 includes a column decoder 81, a precharge circuit 82, an amplifier circuit 83, and a write circuit 84. The precharge circuit 82 has a function of precharging the wiring LBL, the wiring GBL, and the like. The amplifier circuit 83 has a function of amplifying a data signal read from the wiring GBL. The amplified data signal is output to the outside of the semiconductor device 10s as a digital data signal RDATA through the output circuit 73.

As power supply voltage from the outside, low power supply voltage (VSS), high power supply voltage (VDD) for the peripheral circuit 20, and high power supply voltage (VIL) for the memory cell array 90 are supplied to the semiconductor device 10s.

Control signals (CE, WE, and RE), an address signal ADDR, and a data signal WDATA are also input to the semiconductor device 10s from the outside. The address signal ADDR is input to the row decoder 71 and the column decoder 81, and WDATA is input to the write circuit 84.

The control logic circuit 74 processes the signals (CE, WE, and RE) input from the outside, and generates control signals for the row decoder 71 and the column decoder 81. CE is a chip enable signal, WE is a write enable signal, and RE is a read enable signal. The signals processed by the control logic circuit 74 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 17:
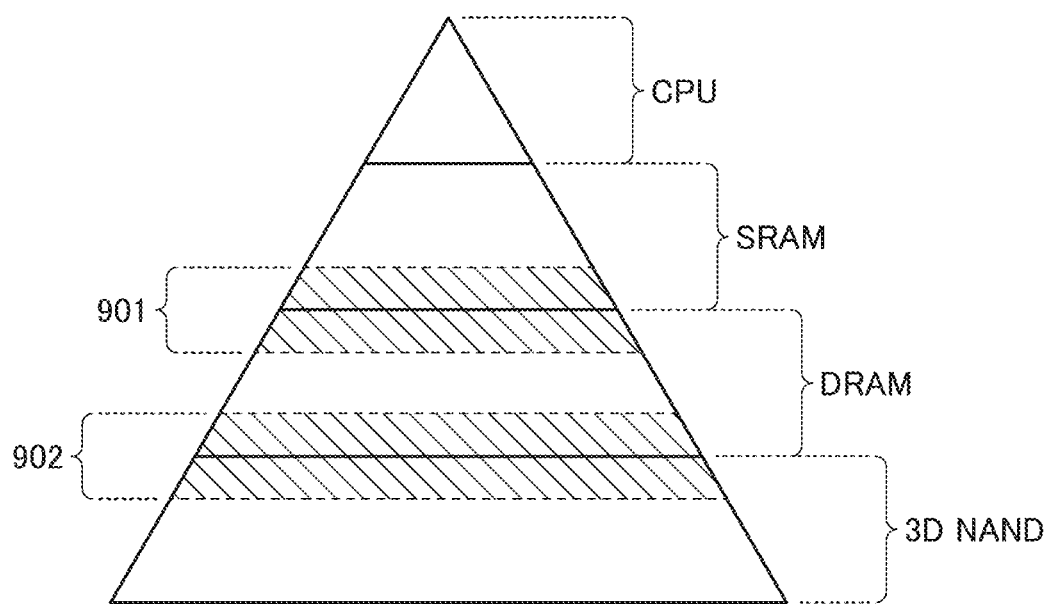
FIG. 17 is a conceptual diagram illustrating a structure example of a semiconductor device.

In general, a variety of memory devices (memories) are used in semiconductor devices such as a computer in accordance with the intended use. FIG. 17 shows a hierarchy diagram showing a variety of memory devices with different levels. The memory devices at the upper levels of the diagram require high access speed, and the memory devices at the lower levels require large memory capacity and high memory density. FIG. 17 illustrates, sequentially from the top level, a memory combined as a register in an arithmetic processing unit such as a CPU, an SRAM (Static Random Access Memory), a DRAM (Dynamic Random Access Memory), and a 3D NAND memory.

A memory combined as a register in an arithmetic processing unit such as a CPU is used for temporary storage of arithmetic operation results, for example, and thus is frequently accessed by the arithmetic processing unit. Accordingly, high operation speed is required rather than memory capacity. In addition, the register also has a function of retaining settings information of the arithmetic processing unit, for example.

An SRAM is used for a cache, for example. The cache has a function of retaining a copy of part of data retained in a main memory. By copying data that is frequently used and retaining the copy of the data in the cache, access speed to the data can be increased.

A DRAM is used for the main memory, for example. The main memory has a function of retaining a program or data read from a storage. The memory density of a DRAM is approximately 0.1 to 0.3 Gbit/mm$^2$.

A 3D NAND memory is used for a storage, for example. A storage has a function of retaining data that needs to be retained for a long time and a variety of programs used in an arithmetic processing unit, for example. Therefore, a storage needs to have high memory capacity and high memory density rather than operating speed. The memory density of a memory device used for a storage is approximately 0.6 to 6.0 Gbit/mm$^2$.

The semiconductor device functioning as the memory device of one embodiment of the present invention operates fast and can retain data for a long time. The semiconductor device of one embodiment of the present invention can be suitably used as a semiconductor device positioned in a boundary region 901 including both the level in which a cache is positioned and the level in which a main memory is positioned. Furthermore, the semiconductor device of one embodiment of the present invention can be suitably used as a semiconductor device positioned in a boundary region 902 including both the level in which a main memory is positioned and the level in which a storage is positioned.

Embodiment 6

In this embodiment, examples of electronic components and electronic devices in which the semiconductor device or the like described in the above embodiment is incorporated will be described.

<Electronic Component>

Figure 18A:
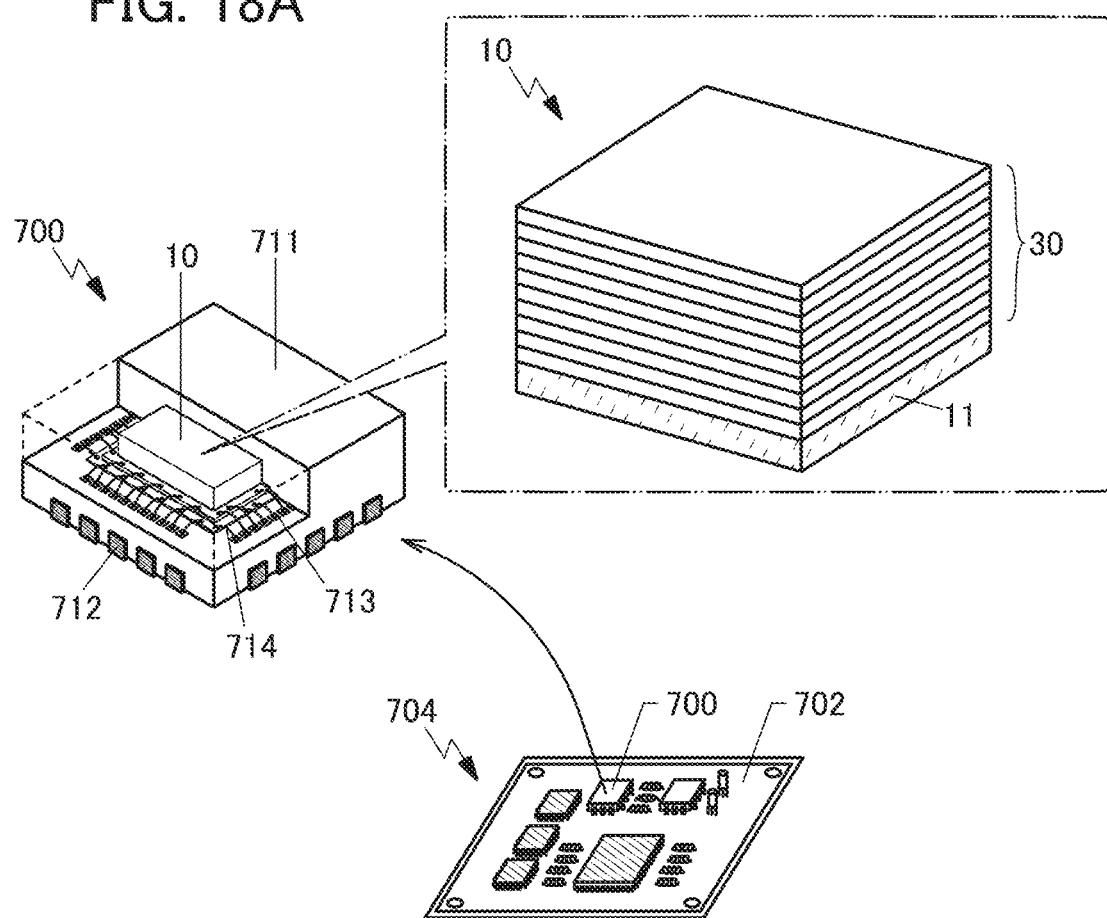
FIG. 18A and FIG. 18B are schematic diagrams illustrating examples of electronic components.
Figure 18B:
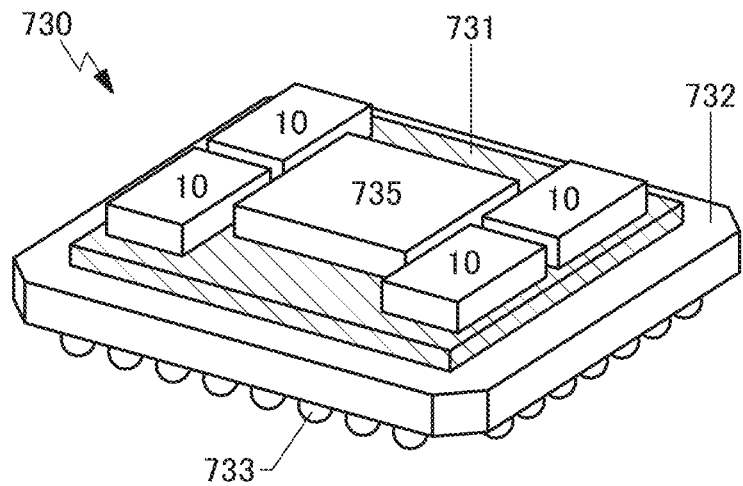

First, examples of electronic components in which the semiconductor device 10 or the like is incorporated are described using FIG. 18A and FIG. 18B.

FIG. 18A illustrates a perspective view of an electronic component 700 and a substrate (a mounting board 704) on which the electronic component 700 is mounted. The electronic component 700 illustrated in FIG. 18A includes the semiconductor device 10 in which the stacked block 30 is stacked over the silicon substrate 11 in a mold 711. Part of the electronic component is not reflected on FIG. 18A so that FIG. 18A illustrates the inside of the electronic component 700. The electronic component 700 includes a land 712 outside the mold 711. The land 712 is electrically connected to an electrode pad 713, and the electrode pad 713 is electrically connected to the semiconductor device 10 via a wire 714. The electronic component 700 is mounted on a printed circuit board 702, for example. A plurality of such electronic components are combined and electrically connected to each other on the printed circuit board 702, so that the mounting board 704 is completed.

FIG. 18B illustrates a perspective view of an electronic component 730. The electronic component 730 is an example of a SiP (System in package) or an MCM (Multi Chip Module). In the electronic component 730, an interposer 731 is provided on a packaging substrate 732 (a printed circuit board), and a semiconductor device 735 and a plurality of semiconductor devices 10 are provided on the interposer 731.

The electronic component 730 using the semiconductor devices 10 as high bandwidth memory (HBM) is illustrated as an example. In addition, an integrated circuit (semiconductor device) such as a CPU, a GPU, or an FPGA can be used for the semiconductor device 735.

As the packaging substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. In addition, the interposer 731 has a function of electrically connecting an integrated circuit provided on the interposer 731 to an electrode provided on the packaging substrate 732. Accordingly, the interposer is sometimes referred to as a "redistribution substrate" or an "intermediate substrate". Furthermore, a through electrode is provided in the interposer 731 and the through electrode is used to electrically connect an integrated circuit and the packaging substrate 732 in some cases. Moreover, for a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In addition, in a SiP, an MCM, or the like using a silicon interposer, the decrease in reliability due to a difference in expansion coefficient between an integrated circuit and the interposer is less likely to occur. Furthermore, a silicon interposer has high surface flatness, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

In addition, a heat sink (a radiator plate) may be provided to overlap the electronic component 730. In the case where a heat sink is provided, the heights of integrated circuits provided on the interposer 731 are preferably aligned with each other. For example, in the electronic component 730 described in this embodiment, the heights of the semiconductor devices 10 and the semiconductor device 735 are preferably aligned with each other.

To mount the electronic component 730 on another substrate, an electrode 733 may be provided on the bottom portion of the packaging substrate 732. FIG. 18B illustrates an example in which the electrode 733 is formed of a solder ball. When solder balls are provided in a matrix on the bottom portion of the packaging substrate 732, BGA (Ball Grid Array) mounting can be achieved. Alternatively, the electrode 733 may be formed of a conductive pin. When conductive pins are provided in a matrix on the bottom portion of the packaging substrate 732, PGA (Pin Grid Array) mounting can be achieved.

The electronic component 730 can be mounted on another substrate by various mounting methods, not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be used.

<Electronic Device>

Figure 19:
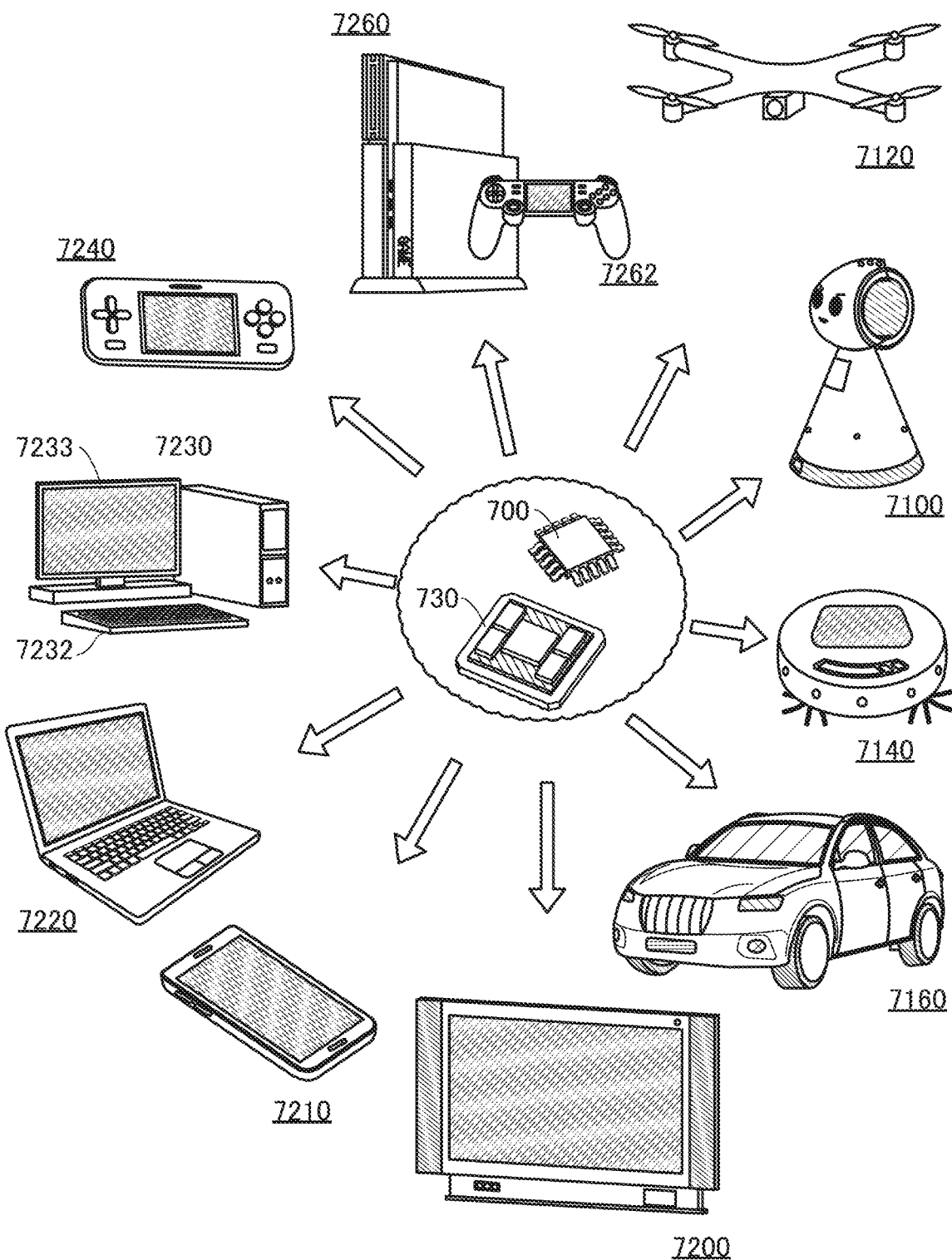
FIG. 19 is a diagram illustrating examples of electronic devices.

Next, examples of electronic devices including the electronic component are described using FIG. 19.

A robot 7100 includes an illuminance sensor, a microphone, a camera, a speaker, a display, various kinds of sensors (an infrared ray sensor, an ultrasonic wave sensor, an acceleration sensor, a piezoelectric sensor, an optical sensor, a gyro sensor, and the like), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a voice of a user, an environmental sound, and the like. In addition, the speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. In addition, the robot 7100 has a function of moving with the use of the moving mechanism. The robot 7100 can take images of the surroundings with the use of the camera and analyze the images to sense whether there is an obstacle in the way of the movement, for example.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement, for example. Moreover, the electronic component 730 can estimate the remaining battery level from a change in the power storage capacity of the battery.

A cleaning robot 7140 includes a display provided on a top surface, a plurality of cameras provided on a side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on a bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

A motor vehicle 7160 includes an engine, tires, a brake, a steering gear, a camera, and the like. For example, the electronic component 730 performs control for optimizing the running state of the motor vehicle 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are respectively examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can also be incorporated in the controller 7262.

This embodiment can be implemented in an appropriate combination with the structures described in the other embodiments and the like.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

PCL1: precharge line, PCL2: precharge line, T11: period, T12: period, T13: period, T14: period, T15: period, T16: period, 10: semiconductor device, 10A: semiconductor device, 10s: semiconductor device, 11: silicon substrate, 20: peripheral circuit, 21: row driver, 22: peripheral circuit, 22_A: precharge circuit, 22_B: precharge circuit, 22_C: sense amplifier, 22_D: switch circuit, 22_E: switch circuit, 23_A: switch, 23_C: switch, 23_D: switch, 24_1: transistor, 24_3: transistor, 24_4: transistor, 24_6: transistor, 25: circuit, 25_1: transistor, 25_2: transistor, 25_3: transistor, 25_4: transistor, 29: circuit, 30: stacked block, 30_N: stacked block, 30_1: stacked block, 31_N_A: memory cell, 31_N_B: memory cell, 40: element layer, 40_1: element layer, 40_2: element layer, 41: transistor, 41_a: transistor, 41_b: transistor, 41_1: transistor, 41_2: transistor, 42: transistor, 42_a: transistor, 42_b: transistor, 43: transistor, 43_a: transistor, 43_b: transistor, 44: transistor, 44_a: transistor, 44_b: transistor, 50: element layer, 50_A: element layer, 50_B: element layer, 50_C: element layer, 50_p: element layer, 50_1: element layer, 50_3: element layer, 50_4: element layer, 51: memory cell, 51_A: memory cell, 51_B: memory cell, 51_c: memory cell, 51_p: memory cell, 51_1: memory cell, 52: transistor, 52_A: transistor, 52_B: transistor, 52B: transistor, 53: capacitor, 53_A: capacitor, 53_B: capacitor, 53A: capacitor, 53B: capacitor, 54: wiring layer, 54_1: wiring, 54_2: wiring, 56: transistor, 57_1: opening portion, 58_1: opening portion, 71: row decoder, 72: word line driver circuit, 73: output circuit, 74: control logic circuit, 75: column driver, 81: column decoder, 82: precharge circuit, 83: amplifier circuit, 84: circuit, 90: memory cell array, 100: IC chip, 100A: IC chip, 100B: IC chip, 101: packaging substrate, 102: solder ball, 103: through electrode, 104: metal bump, 105: silicon substrate, 200T: transistor, 300: transistor, 311: semiconductor substrate, 411: element layer, 413: transistor layer, 413_m: transistor layer, 413_1: transistor layer, 415: memory device layer, 415_n: memory device layer, 415_1: memory device layer, 420: memory device, 424: conductor, 426: conductor, 427: conductor, 428: conductor, 430: conductor, 450: substrate, 470: memory unit, 470_m: memory unit, 470_1: memory unit, 700: electronic component, 702: printed circuit board, 704: mounting board, 711: mold, 712: land, 713: electrode pad, 714: wire, 730: electronic component, 731: interposer, 732: packaging substrate, 733: electrode, 735: semiconductor device, 901: boundary region, 902: boundary region, 7100: motor robot, 7120: flying object, 7140: cleaning robot, 7160: motor vehicle, 7200: TV device, 7210: smartphone, 7220: PC, 7230: PC, 7232: keyboard, 7233: monitor device, 7240: game machine, 7260: game machine, 7262: controller, and 7300: cleaning robot.

The invention claimed is:

1. A semiconductor device comprising:
a silicon substrate including a first circuit;
a first element layer over the silicon substrate; and
a second element layer over the first element layer,
wherein the first element layer includes a second circuit,
wherein the second element layer includes a third circuit,
wherein the first circuit includes a driver circuit,
wherein the driver circuit includes a first transistor,
wherein the second circuit includes a second transistor,
wherein the third circuit includes a memory cell,
wherein the memory cell includes a third transistor and a first capacitor,
wherein a plurality of stacked blocks are stacked and provided in a direction perpendicular or substantially perpendicular to a surface of the silicon substrate, the stacked blocks being constituted by the first element layer and the second element layer,
wherein the driver circuit included in the first circuit and the plurality of stacked blocks overlap with each other,
wherein each of the plurality of stacked blocks includes a first wiring provided in the direction perpendicular or substantially perpendicular to the surface of the silicon substrate,
wherein the first wiring is provided in a hole penetrating the first element layer and the second element layer, and
wherein the first wirings of the plurality of stacked blocks are electrically connected to each other.

2. The semiconductor device according to claim 1, wherein the first circuit is configured to output a signal for driving the memory cell and data to be written to the memory cell to the first wiring and is configured to amplify data read from the memory cell into the first wiring.

3. The semiconductor device according to claim 1, wherein the second circuit is configured to amplify a potential of a second wiring electrically connected to the memory cell and transmit the amplified potential to the first wiring and is configured to transmit a potential of the first wiring to the second wiring.

4. The semiconductor device according to claim 1, wherein the second transistor and the third transistor each include a semiconductor layer including a metal oxide in a channel formation region.

5. The semiconductor device according to claim 4, wherein the metal oxide contains In, Ga, and Zn.

6. The semiconductor device according to claim 1, wherein a first layer including the first capacitor is provided above a layer including the third transistor.

7. The semiconductor device according to claim 6, wherein a second layer including a second capacitor is stacked and provided on top of the first layer.

* * * * *